(12) United States Patent
Nishimoto et al.

(10) Patent No.: US 8,652,350 B2
(45) Date of Patent: Feb. 18, 2014

(54) CHEMICAL MECHANICAL POLISHING AQUEOUS DISPERSION, CHEMICAL MECHANICAL POLISHING METHOD USING THE SAME, AND METHOD OF RECYCLING CHEMICAL MECHANICAL POLISHING AQUEOUS DISPERSION

(75) Inventors: Kazuo Nishimoto, Yokkaichi (JP); Tomotaka Shinoda, Koto-ku (JP)

(73) Assignee: JSR Corporation, Tokyo (JP)

( * ) Notice: Subject to any disclaimer, the term of this patent is extended or adjusted under 35 U.S.C. 154(b) by 588 days.

(21) Appl. No.: 12/919,897

(22) PCT Filed: Feb. 6, 2009

(86) PCT No.: PCT/JP2009/052058
§ 371 (c)(1),
(2), (4) Date: Dec. 13, 2010

(87) PCT Pub. No.: WO2009/107472
PCT Pub. Date: Sep. 3, 2009

(65) Prior Publication Data
US 2011/0117821 A1 May 19, 2011

(30) Foreign Application Priority Data

| Feb. 27, 2008 | (JP) | 2008-045636 |
| Feb. 27, 2008 | (JP) | 2008-045638 |
| Feb. 27, 2008 | (JP) | 2008-045639 |
| Jun. 24, 2008 | (JP) | 2008-164120 |
| Jun. 24, 2008 | (JP) | 2008-164122 |

(51) Int. Cl.
*C09K 13/06* (2006.01)

(52) U.S. Cl.
USPC .............. 252/79.4; 252/79.1; 51/308; 51/309

(58) Field of Classification Search
USPC ............................ 252/79.1, 79.4; 51/308, 309
See application file for complete search history.

(56) References Cited

U.S. PATENT DOCUMENTS

| 5,914,275 A | 6/1999 | Kodera et al. |
| 6,106,728 A | 8/2000 | Iida et al. |
| 6,110,839 A * | 8/2000 | Nakano et al. ............ 438/753 |
| 6,126,531 A | 10/2000 | Iida et al. |
| 6,183,352 B1 | 2/2001 | Kurisawa |
| 6,413,151 B2 | 7/2002 | Mizuno et al. |
| 7,022,608 B2 * | 4/2006 | Sun et al. ............... 438/691 |
| 7,560,384 B2 | 7/2009 | Shida et al. |
| 2002/0068454 A1 | 6/2002 | Sun et al. |
| 2002/0098701 A1 | 7/2002 | Hasegawa |
| 2003/0196386 A1 * | 10/2003 | Hattori et al. ............... 51/307 |
| 2003/0216049 A1 | 11/2003 | Sun et al. |
| 2005/0074967 A1 * | 4/2005 | Kondo et al. ............ 438/630 |
| 2006/0138087 A1 * | 6/2006 | Simka et al. ............... 216/88 |
| 2006/0201914 A1 | 9/2006 | Uchikura et al. |
| 2006/0205325 A1 | 9/2006 | Abe et al. |
| 2006/0276041 A1 | 12/2006 | Uchikura et al. |
| 2007/0128874 A1 | 6/2007 | Shida et al. |
| 2008/0318427 A1 | 12/2008 | Kunitani et al. |
| 2009/0124172 A1 | 5/2009 | Uchikura et al. |
| 2009/0165395 A1 | 7/2009 | Ikeda et al. |
| 2009/0181540 A1 | 7/2009 | Shida et al. |
| 2009/0221213 A1 | 9/2009 | Namie et al. |
| 2009/0239373 A1 | 9/2009 | Shida et al. |
| 2009/0291620 A1 | 11/2009 | Kunitani et al. |
| 2009/0302266 A1 | 12/2009 | Takemura et al. |
| 2009/0325383 A1 | 12/2009 | Andou et al. |
| 2010/0075501 A1 | 3/2010 | Abe et al. |
| 2010/0099260 A1 | 4/2010 | Matsumoto et al. |
| 2010/0221918 A1 | 9/2010 | Takemura et al. |
| 2011/0250756 A1 | 10/2011 | Uchikura et al. |

FOREIGN PATENT DOCUMENTS

| JP | 6 216096 | 8/1994 |
| JP | 11 10540 | 1/1999 |
| JP | 11 277434 | 10/1999 |
| JP | 2000 71172 | 3/2000 |
| JP | 2001 162534 | 6/2001 |
| JP | 2002 170793 | 6/2002 |
| JP | 2002 203818 | 7/2002 |
| JP | 2002 353222 | 12/2002 |
| JP | 2004 149667 | 5/2004 |
| JP | 2004 526296 | 8/2004 |
| WO | 2004 084287 | 9/2004 |
| WO | 2007 116770 | 10/2007 |

OTHER PUBLICATIONS

U.S. Appl. No. 12/749,934, filed Mar. 30, 2010, Shida, et al.
U.S. Appl. No. 12/866,571, filed Aug. 6, 2010, Shida, et al.
U.S. Appl. No. 12/918,013, filed Aug. 17, 2010, Shida, et al.
U.S. Appl. No. 12/867,954, filed Aug. 17, 2010, Motonari, et al.
International Search Report issued Apr. 28, 2009 in PCT/JP09/052058 filed Feb. 6, 2009.

* cited by examiner

*Primary Examiner* — Shamim Ahmed
(74) *Attorney, Agent, or Firm* — Oblon, Spivak, McClelland, Maier & Neustadt, L.L.P.

(57) ABSTRACT

A chemical mechanical polishing aqueous dispersion includes (A) abrasive grains, (B) an organic acid, and (C1) copper ions or (C2) at least one kind of metal atoms selected from Ta, Ti, and Rb, the chemical mechanical polishing aqueous dispersion including the copper ions (C1) at a concentration of $1 \times 10^1$ to $2 \times 10^5$ ppm, or including the at least one kind of metal atoms (C2) selected from Ta, Ti, and Rb at a concentration of $1 \times 10^{-1}$ to $1 \times 10^3$ ppm.

14 Claims, 3 Drawing Sheets

CHEMICAL MECHANICAL POLISHING AQUEOUS DISPERSION, CHEMICAL MECHANICAL POLISHING METHOD USING THE SAME, AND METHOD OF RECYCLING CHEMICAL MECHANICAL POLISHING AQUEOUS DISPERSION

TECHNICAL FIELD

The present invention relates to a chemical mechanical polishing aqueous dispersion, a chemical mechanical polishing method using the same, and a method of recycling a chemical mechanical polishing aqueous dispersion.

BACKGROUND ART

A copper damascene interconnect of a high-performance LSI is normally formed by chemical mechanical polishing (hereinafter may be referred to as "CMP"). Specifically, a desired interconnect is formed by filling a groove or the like formed in an insulating material with an interconnect material, and removing unnecessary interconnect material by chemical mechanical polishing.

A chemical mechanical polishing process discharges polishing liquid waste (hereinafter may be referred to as "CMP liquid waste") that contains a chemical mechanical polishing aqueous dispersion used for CMP, polishing waste produced from the material of each layer of a semiconductor device formed on a wafer (i.e., polishing target), polishing waste produced from a polishing pad, etc. Polishing waste contained in the CMP liquid waste damages the polishing target surface of each layer of the semiconductor device, and the polishing performance deteriorates when polishing waste has been accumulated. Therefore, CMP liquid waste is not recycled as the chemical mechanical polishing aqueous dispersion. In recent years, the amount of chemical mechanical polishing aqueous dispersion used has rapidly increased along with an increase in the degree of integration of semiconductor devices. Therefore, a reduction in the amount of CMP liquid waste has been desired.

The most efficient CMP liquid waste reduction method is to recycle the chemical mechanical polishing aqueous dispersion from the viewpoint of reducing environmental impact while reducing the semiconductor device production cost. For example, JP-A-11-10540 discloses technology that recycles the chemical mechanical polishing aqueous dispersion using an ion-removing membrane. JP-A-11-277434 discloses technology that recycles the chemical mechanical polishing aqueous dispersion by dispersing the abrasive grains using a vibrator. JP-A-2000-71172 and JP-A-2001-162534 disclose technology that adds an unused chemical mechanical polishing aqueous dispersion and additives to the used chemical mechanical polishing aqueous dispersion to recycle the chemical mechanical polishing aqueous dispersion. JP-A-2002-170793 discloses technology that removes coarse particles from CMP liquid waste by centrifugation, and uses the collected abrasive grains for a chemical mechanical polishing aqueous dispersion.

However, these recycling systems have a problem in that metal ions produced by polishing an interconnect metal (e.g., copper) are accumulated so that the polishing performance after recycling significantly deteriorates as compared with the initial polishing performance.

In recent years, attempts have been made to apply CMP to planarize a substrate (hereinafter referred to as "electro-optical display substrate") used to produce an electro-optical display such as a flat panel display (e.g., liquid crystal display (LCD), plasma display panel (PDP), electrochromic display (ECD), electroluminescent display (ELD), and field emission display (FED)). However, since the electro-optical display substrate normally has a maximum dimension of about 1500 to 3000 mm, a large amount of interconnect material must be removed as compared with a semiconductor device substrate. When chemically and mechanically polishing an interconnect material of the electro-optical display substrate, metal ions produced from the interconnect metal during CMP are accumulated in the chemical mechanical polishing aqueous dispersion so that the polishing performance significantly deteriorates as compared with the initial polishing performance.

DISCLOSURE OF THE INVENTION

An object of the invention is to provide a chemical mechanical polishing aqueous dispersion that exhibits excellent polishing performance on a metal film (e.g., copper or copper alloy), a barrier metal film (e.g., Ta), and an insulating film, can be recycled by a simple process, and can stably polish an interconnect material formed on a large electro-optical display substrate or the like while maintaining the initial polishing performance, and a chemical mechanical polishing method using the same.

Another object of the invention is to provide a method of recycling a chemical mechanical polishing aqueous dispersion that can recycle a chemical mechanical polishing aqueous dispersion by a simple process while substantially maintaining the initial polishing performance.

A chemical mechanical polishing aqueous dispersion according to the invention comprises:

(A) abrasive grains;
(B) an organic acid; and
(C1) copper ions or (C2) at least one kind of metal atoms selected from Ta, Ti, and Rb, the chemical mechanical polishing aqueous dispersion including the copper ions (C1) at a concentration of $1\times10^1$ to $2\times10^5$ ppm, or including the at least one kind of metal atoms (C2) selected from Ta, Ti, and Rb at a concentration of $1\times10^{-1}$ to $1\times10^3$ ppm.

The chemical mechanical polishing aqueous dispersion according to the invention may be recycled after removing copper ions that have been dissolved by subjecting an interconnect layer that includes at least copper or a copper alloy to chemical mechanical polishing, and the concentration of the copper ions (C1) may be $1\times10^1$ to $1\times10^4$ ppm.

The chemical mechanical polishing aqueous dispersion according to the invention may be recycled without removing copper ions that have been dissolved by subjecting an interconnect layer that includes at least copper or a copper alloy to chemical mechanical polishing, and the concentration of the copper ions (C1) may be $5\times10^4$ to $2\times10^5$ ppm.

The chemical mechanical polishing aqueous dispersion according to the invention may be used to polish an interconnect layer that is provided on an electro-optical display substrate and includes copper or a copper alloy, and the concentration of the copper ions (C1) may be $1\times10^3$ to $2\times10^5$ ppm.

In the chemical mechanical polishing aqueous dispersion according to the invention, the organic acid (B) may be at least one organic acid selected from a compound that includes a nitrogen-containing heterocyclic five-membered ring and a carboxyl group, a compound that includes a nitrogen-containing six-membered ring and a carboxyl group, and an amino acid.

The chemical mechanical polishing aqueous dispersion according to the invention may be recycled after removing metal atoms that have been dissolved by subjecting a barrier metal film that includes at least one metal selected from Ta, Ti, and Rb to chemical mechanical polishing, and the concentration of the at least one kind of metal atoms (C2) selected from Ta, Ti, and Rb may be $1\times10^{-1}$ to $1\times10^2$ ppm.

The chemical mechanical polishing aqueous dispersion according to the invention may be used to polish a barrier metal film that is provided on an electro-optical display substrate and includes at least one metal selected from Ta, Ti, and Rb, and the concentration of the at least one kind of metal atoms (C2) selected from Ta, Ti, and Rb may be $1\times10^1$ to $1\times10^3$ ppm.

In the chemical mechanical polishing aqueous dispersion according to the invention, the organic acid (B) may be a compound that includes two or more carboxyl groups.

The chemical mechanical polishing aqueous dispersion according to the invention may further include (E) a water-soluble polymer.

In the chemical mechanical polishing aqueous dispersion according to the invention, the water-soluble polymer (E) may have a weight average molecular weight of 50,000 to 5,000,000.

In the chemical mechanical polishing aqueous dispersion according to the invention, the abrasive grains (A) may be silica.

The chemical mechanical polishing aqueous dispersion according to the invention may further include (D) a surfactant.

According to the invention, there is provided a method of recycling a chemical mechanical polishing aqueous dispersion by utilizing a liquid waste that is discharged after polishing an interconnect layer that includes copper or copper alloy by using the chemical mechanical polishing aqueous dispersion, the chemical mechanical polishing aqueous dispersion including at least (A) abrasive grains, (B) an organic acid, and (C) copper ions, the chemical mechanical polishing aqueous dispersion including the copper ions (C1) at a concentration of $1\times10^1$ to $2\times10^5$ ppm, and the method including (a) collecting the liquid waste, and (b) removing coarse particles from the liquid waste.

According to the invention, there is provided a method of recycling a chemical mechanical polishing aqueous dispersion by utilizing a liquid waste that is discharged after polishing a barrier metal film that includes at least one metal selected from Ta, Ti, and Rb by using the chemical mechanical polishing aqueous dispersion, the chemical mechanical polishing aqueous dispersion including at least (A) abrasive grains, (B) an organic acid, and (C2) at least one kind of metal atoms selected from Ta, Ti, and Rb, the chemical mechanical polishing aqueous dispersion including the at least one kind of metal atoms (C2) selected from Ta, Ti, and Rb at a concentration of $1\times10^{-1}$ to $1\times10^3$ ppm, and the method including (a) collecting the liquid waste, and (b) removing coarse particles from the liquid waste.

A chemical mechanical polishing method according to the invention comprises polishing an interconnect layer that includes copper or copper alloy or a barrier metal film that includes at least one metal selected from Ta, Ti, and Rb using the above chemical mechanical polishing aqueous dispersion.

The chemical mechanical polishing aqueous dispersion according to the invention exhibits excellent polishing performance on an interconnect layer that includes copper, a copper alloy, etc., a barrier metal film (e.g., Ta), and an insulating film, and can be recycled by a simple process. The chemical mechanical polishing aqueous dispersion according to the invention can stably polish an interconnect material formed on a large electro-optical display substrate or the like while maintaining the initial polishing performance.

The method of recycling a chemical mechanical polishing aqueous dispersion according to the invention can recycle a chemical mechanical polishing aqueous dispersion by a simple process while substantially maintaining the initial polishing performance.

BEST MODE FOR CARRYING OUT THE INVENTION

Figure 1A:
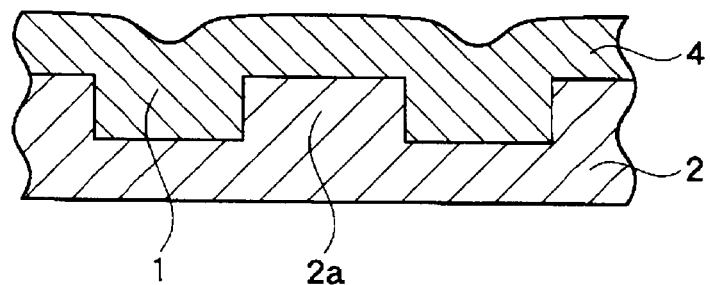
FIG. 1A is a cross-sectional view schematically illustrating a step of a chemical mechanical polishing method according to one embodiment of the invention.

Preferred embodiments of the invention are described in detail below. Note that the invention is not limited to the following embodiments. The invention includes various modifications that may be implemented without departing from the scope of the invention.

1. Chemical Mechanical Polishing Aqueous Dispersion 1.1 First Embodiment

A chemical mechanical polishing aqueous dispersion according to a first embodiment of the invention includes (A)

abrasive grains, (B) an organic acid, and (C1) copper ions, the chemical mechanical polishing aqueous dispersion including the copper ions (C1) at a concentration of $1 \times 10^1$ to $2 \times 10^5$ ppm.

Each component of the chemical mechanical polishing aqueous dispersion according to the first embodiment is described in detail below. Note that the abrasive grains (A), etc., may be referred to as a component (A), etc.

1.1.1 Abrasive Grains (A)

The chemical mechanical polishing aqueous dispersion according to the first embodiment includes the abrasive grains (A). The chemical mechanical polishing aqueous dispersion may include at least one type of abrasive grains selected from inorganic particles and organic particles as the abrasive grains (A). Examples of the inorganic particles include silica, alumina, titania, zirconia, ceria, and the like. Examples of the organic particles include polyvinyl chloride, polystyrene, styrene copolymers, polyacetals, saturated polyesters, polyamides, polycarbonates, polyolefins (e.g., polyethylene, polypropylene, poly-1-butene, and poly-4-methyl-1-pentene), olefin copolymers, phenoxy resins, (meth)acrylic resins (e.g., polymethyl methacrylate), acrylic copolymers, and the like.

The inorganic particles are preferably silica. Examples of silica include fumed silica that is synthesized by reacting silicon chloride, aluminum chloride, titanium chloride, or the like with oxygen and hydrogen in a gas phase using a fuming method, silica synthesized by subjecting a metal alkoxide to hydrolysis and condensation using a sol-gel method, colloidal silica which is synthesized by an inorganic colloid method or the like and from which impurities have been removed by purification; and the like. Among these, it is particularly preferable to use colloidal silica which is synthesized by an inorganic colloid method or the like and from which impurities have been removed by purification. The average particle diameter of the colloidal silica is preferably 100 nm or less from the viewpoint of reducing erosion and scratches that may occur on the polishing target surface.

The average particle diameter of the abrasive grains (A) is preferably 5 to 1000 nm. The average particle diameter of the abrasive grains (A) may be measured using a laser scattering diffraction measuring instrument. Alternatively, the particles may be observed using a transmission electron microscope, and the average particle diameter may be calculated from the cumulative particle diameter and the number of particles. If the average particle diameter of the abrasive grains (A) is less than 5 nm, a chemical mechanical polishing aqueous dispersion that achieves a sufficiently high polishing rate may not be obtained. If the average particle diameter of the abrasive grains (A) is more than 1000 nm, dishing and erosion may not be sufficiently reduced. Moreover, a stable chemical mechanical polishing aqueous dispersion may not be easily obtained due to precipitation/separation of the abrasive grains (A). The average particle diameter of the abrasive grains (A) is more preferably 10 to 700 nm, and particularly preferably 15 to 500 nm. If the average particle diameter of the abrasive grains (A) is within the above range, it is possible to obtain a stable chemical mechanical polishing aqueous dispersion that achieves a high polishing rate, sufficiently reduces dishing and erosion, and rarely gives rise to precipitation/separation of the particles.

The content of the abrasive grains (A) is preferably 0.01 to 15 mass %, more preferably 0.05 to 10 mass %, and particularly preferably 0.05 to 5 mass %, based on the total mass of the chemical mechanical polishing aqueous dispersion. If the content of the abrasive grains (A) is less than 0.01 mass %, a sufficient polishing rate may not be achieved. If the content of the abrasive grains (A) is more than 15 mass %, cost may increase. Moreover, a stable chemical mechanical polishing aqueous dispersion may not be obtained.

1.1.2 Organic Acid (B)

The chemical mechanical polishing aqueous dispersion according to the first embodiment includes the organic acid (B). The organic acid (B) is preferably an organic acid that can coordinate to a copper ion or the surface of a copper film, and more preferably an organic acid that can coordinate to a copper ion or the surface of a copper film via chelate coordination. Examples of the organic acid that can coordinate to a copper ion or the surface of a copper film via chelate coordination include a compound that includes a nitrogen-containing heterocyclic five-membered ring and a carboxyl group, a compound that includes a nitrogen-containing heterocyclic six-membered ring and a carboxyl group, an amino acid, and the like.

Examples of the nitrogen-containing heterocyclic five-membered ring include a pyrrole structure, an imidazole structure, a triazole structure, and the like. Examples of the nitrogen-containing heterocyclic six-membered ring include a pyridine structure, a pyrimidine structure, a pyridazine structure, a pyrazine structure, and the like. These nitrogen-containing heterocyclic rings may form a condensed ring. Specific examples of such a condensed ring include an indole structure, an isoindole structure, a benzimidazole structure, a benzotriaole structure, a quinoline structure, an isoquinoline structure, a quinazoline structure, a cinnoline structure, a phthalazine structure, a quinoxaline structure, an acridine structure, and the like. It is preferable to use an organic compound having a pyridine structure, a quinoline structure, a benzimidazole structure, or a benzotriaole structure.

Examples of the compound that includes a nitrogen-containing heterocyclic five-membered ring and a carboxyl group and the compound that includes a nitrogen-containing heterocyclic six-membered ring and a carboxyl group include quinolinecarboxylic acid, pyridinecarboxylic acid, pyridinedicarboxylic acid, pyrazinecarboxylic acid, and the like. Among these, quinaldic acid (2-quinolinecarboxylic acid) and quinolinic acid (2,3-pyridinedicarboxylic acid) are preferable.

Examples of the amino acid include alanine, arginine, asparagine, aspartic acid, cysteine, glutamine, glutamic acid, glycine, isoleucine, leucine, lysine, methionine, phenylalanine, serine, threonine, tyrosine, valine, and the like. It is most preferable to use histidine, tryptophan, or proline (i.e., an amino acid that includes a nitrogen-containing heterocyclic five-membered ring and a carboxyl group or an amino acid that includes a nitrogen-containing heterocyclic six-membered ring and a carboxyl group) as the component (B).

These organic acids (B) may be used either individually or in combination. It is preferable that the organic acid (B) include the same compound as a ligand used for a copper complex described later.

The content of the organic acid (B) is preferably 0.01 to 5 mass %, and more preferably 0.05 to 2 mass %, based on the total mass of the chemical mechanical polishing aqueous dispersion. If the content of the organic acid (B) is less than 0.01 mass %, copper ions may precipitate when recycling the chemical mechanical polishing aqueous dispersion, so that scratches may occur on the polishing target wafer. If the content of the organic acid (B) is more than 5 mass %, corrosion or dishing of an interconnect layer that includes a copper film or a copper alloy film may occur to a large extent.

1.1.3 Copper Ions (C1)

The chemical mechanical polishing aqueous dispersion according to the first embodiment includes the copper ions (C1). The concentration of the copper ions (C1) is $1\times10^1$ to $2\times10^5$ ppm. If the concentration of the copper ions (C1) is within the above range, a change in copper ion concentration in the chemical mechanical polishing aqueous dispersion can be controlled when polishing an interconnect layer that includes at least copper or a copper alloy, so that the polishing performance can be stabilized. When recycling the chemical mechanical polishing aqueous dispersion according to this embodiment, since a change in copper ion concentration in the chemical mechanical polishing aqueous dispersion due to recycling is small, a stable polishing performance can be maintained. For example, when the copper ion concentration in the chemical mechanical polishing aqueous dispersion before polishing a copper film or a copper alloy film is 100 parts by mass, an increase in copper ion concentration in the chemical mechanical polishing aqueous dispersion due to copper ions dissolved when polishing the copper film or the copper alloy film can be controlled within the range of 1 to 10 parts by mass, preferably 1.5 to 8 parts by mass, and more preferably 2 to 5 parts by mass, so that a change in polishing performance of the chemical mechanical polishing aqueous dispersion can be controlled during polishing. Therefore, when the polishing target is an electro-optical display substrate that has a large polishing target area, the substrate can be uniformly polished.

If the concentration of the copper ions (C1) in the chemical mechanical polishing aqueous dispersion according to the first embodiment is within the above range, removal of copper ions dissolved into the chemical mechanical polishing aqueous dispersion due to polishing can be simplified (described later), so that the chemical mechanical polishing aqueous dispersion can be easily recycled. If the concentration of the copper ions (C1) in the chemical mechanical polishing aqueous dispersion is more than $2\times10^5$ ppm, copper ions may adhere to the polished interconnect, so that a decrease in yield or the like may occur due to a deterioration in electrical properties of the semiconductor circuit (i.e., polishing target). If the concentration of the copper ions (C1) in the chemical mechanical polishing aqueous dispersion is less than $1\times10^1$ ppm, it may be very difficult to remove copper ions to the initial concentration. This may make it difficult to recycle the chemical mechanical polishing aqueous dispersion so that the chemical mechanical polishing aqueous dispersion has a polishing performance almost equal to the initial polishing performance.

A preferable concentration of the copper ions (C1) in the chemical mechanical polishing aqueous dispersion according to the first embodiment may be specified as follows depending on the application of the chemical mechanical polishing aqueous dispersion.

(1) First Application

When the chemical mechanical polishing aqueous dispersion is used to chemically and mechanically polish a metal film (e.g., copper or copper alloy), a barrier metal film (e.g., tantalum), and an insulating film formed on a semiconductor substrate (e.g., silicon wafer), and is recycled after removing copper ions that have been dissolved due to polishing, the concentration of the copper ions (C1) is preferably $1\times10^1$ to $1\times10^4$ ppm, more preferably $1\times10^2$ to $8\times10^3$ ppm, and particularly preferably $5\times10^2$ to $5\times10^3$ ppm. If the concentration of the copper ions (C1) in the chemical mechanical polishing aqueous dispersion used for the first application is within the above range, copper ions dissolved into the chemical mechanical polishing aqueous dispersion can be removed by a simple operation (described later), so that the chemical mechanical polishing aqueous dispersion can be recycled. If the concentration of the copper ions (C1) in the chemical mechanical polishing aqueous dispersion is more than $1\times10^4$ ppm, copper ions may adhere to the polished interconnect, so that a decrease in yield or the like may occur due to a deterioration in electrical properties of the semiconductor circuit (i.e., polishing target) (i.e., the polishing performance may deteriorate). If the concentration of the copper ions (C1) in the chemical mechanical polishing aqueous dispersion is less than $1\times10^1$ ppm, it may be very difficult to remove copper ions to the initial concentration. This may make it difficult to recycle the chemical mechanical polishing aqueous dispersion so that the chemical mechanical polishing aqueous dispersion has a polishing performance almost equal to the initial polishing performance.

(2) Second Application

When the chemical mechanical polishing aqueous dispersion is used to chemically and mechanically polish a metal film (e.g., copper or copper alloy), a barrier metal film (e.g., Ta), and an insulating film formed on a semiconductor substrate (e.g., silicon wafer), and is recycled without adjusting the components after polishing, the concentration of the copper ions (C1) is preferably $5\times10^4$ to $2\times10^5$ ppm, more preferably $6\times10^4$ to $1\times10^5$ ppm, and particularly preferably $7\times10^4$ to $9\times10^4$ ppm. If the concentration of the copper ions (C1) in the chemical mechanical polishing aqueous dispersion used for the second application is more than $2\times10^5$ ppm, copper ions may adhere to the polished interconnect, so that a decrease in yield or the like may occur due to a deterioration in electrical properties of the semiconductor circuit (i.e., polishing target) (i.e., the polishing performance may deteriorate). If the concentration of the copper ions (C1) in the chemical mechanical polishing aqueous dispersion is less than $5\times10^4$ ppm, a change in copper ion concentration in the chemical mechanical polishing aqueous dispersion due to polishing may increase, so that a stable polishing performance may not be maintained.

(3) Third Application

When the chemical mechanical polishing aqueous dispersion is used to chemically and mechanically polish an interconnect layer that is formed of copper or a copper alloy on an electro-optical display substrate, the concentration of the copper ions (C1) is preferably $1\times10^3$ to $1\times10^5$ ppm, more preferably $3\times10^3$ to $8\times10^4$ ppm, and particularly preferably $5\times10^3$ to $5\times10^4$ ppm. If the concentration of the copper ions (C1) in the chemical mechanical polishing aqueous dispersion used for the third application is within the above range, a change in copper ion concentration in the chemical mechanical polishing aqueous dispersion due to chemical mechanical polishing can be controlled, so that the polishing performance can be stabilized during polishing. If the concentration of the copper ions (C1) in the chemical mechanical polishing aqueous dispersion is more than $1\times10^5$ ppm, copper ions may adhere to the polished interconnect, so that a decrease in yield or the like may occur due to a deterioration in electrical properties of the semiconductor circuit (i.e., polishing target) (i.e., the polishing performance may deteriorate). If the concentration of the copper ions (C1) in the chemical mechanical polishing aqueous dispersion is less than $1\times10^3$ ppm, a change in copper ion concentration in the chemical mechanical polishing aqueous dispersion due to chemical mechanical polishing may increase, so that the polishing performance may not be stabilized during polishing.

Note that the concentration of the copper ions (C1) in the chemical mechanical polishing aqueous dispersion according to the first embodiment refers to the weight ratio of the copper ions (C1) to the total weight of the chemical mechanical polishing aqueous dispersion. The concentration of the copper ions (C1) may be determined by atomic absorption analysis, total-reflection X-ray fluorescence analysis, or the like.

The chemical mechanical polishing aqueous dispersion according to the first embodiment includes the copper ions (C1) at the above concentration before use (i.e., differs from a chemical mechanical polishing aqueous dispersion in which copper ions are incorporated during polishing).

The chemical mechanical polishing aqueous dispersion according to the first embodiment may include the copper ions (C1) as a water-soluble inorganic salt or a salt with an organic acid. Examples of the water-soluble inorganic salt include copper sulfate, copper chloride, copper nitrate, and the like. The salt with an organic acid is preferably a salt or a complex with the organic acid (B). If the chemical mechanical polishing aqueous dispersion includes the organic acid (B) and the copper ions (C1) as a salt with the organic acid (B), copper ions dissolved into the chemical mechanical polishing aqueous dispersion due to polishing have the same chemical properties as those of the salt with the organic acid (B). Therefore, the polishing performance of the chemical mechanical polishing aqueous dispersion does not change even if copper ions are not sufficiently removed when recycling the chemical mechanical polishing aqueous dispersion.

1.2 Second Embodiment

A chemical mechanical polishing aqueous dispersion according to a second embodiment of the invention includes (A) abrasive grains, (B) an organic acid, and (C2) at least one kind of metal atoms selected from Ta, Ti, and Rb, the chemical mechanical polishing aqueous dispersion including the at least one kind of metal atoms (C2) selected from Ta, Ti, and Rb at a concentration of $1\times10^{-1}$ to $1\times10^3$ ppm.

Each component of the chemical mechanical polishing aqueous dispersion according to the second embodiment is described in detail below.

1.2.1 Abrasive Grains (A)

The chemical mechanical polishing aqueous dispersion according to the second embodiment includes the abrasive grains (A). The abrasive grains (A) described in connection with the first embodiment may be used as the abrasive grains (A) in the second embodiment. Therefore, description thereof is omitted.

1.2.2 Organic Acid (B)

The chemical mechanical polishing aqueous dispersion according to the second embodiment includes the organic acid (B). The polishing rate can be adjusted by adding the organic acid (B). For example, the ratio of the polishing rate of an interconnect layer that is formed of copper or a copper alloy to the polishing rate of a barrier metal film that is formed of Ta or Ti, a nitride or an oxide thereof, or a Ta or Ti alloy can be adjusted to a value desired for the objective.

A carboxylic acid organic compound is preferable as the organic acid (B). The organic acid (B) is more preferably a carboxylic acid organic compound that includes two or more carboxyl groups in the molecule. Examples of such a compound include maleic acid, succinic acid, phthalic acid, citric acid, and the like. The organic acid (B) is particularly preferably a carboxylic acid organic compound that includes two carboxyl groups in the molecule. Examples of such a compound include maleic acid. When adding an organic acid compound that does not include a carboxyl group, the polishing target surface may not be polished at a sufficient polishing rate.

The organic acid (B) may dissociate in the chemical mechanical polishing aqueous dispersion. In this case, the dissociating site of the divalent or higher valency acid may be a monovalent or higher valency site. The counter cation of the dissociating site may be a hydrogen ion or a cation derived from an optional additive (e.g., ammonium ion or potassium ion).

The content of the organic acid (B) is preferably 0.01 to 3 mass %, more preferably 0.05 to 2 mass %, and particularly preferably 0.1 to 1.5 mass %, based on the total mass of the chemical mechanical polishing aqueous dispersion. If the content of the organic acid (B) is less than 0.01 mass %, a sufficient polishing rate may not be achieved. As a result, it may take time to complete polishing. If the content of the organic acid (B) is more than 3 mass %, the flatness of the polishing target surface may be impaired due to an increase in chemical etching effect.

1.2.3 At least One Kind of Atoms (C2) Selected from Ta, Ti, and Ru

The chemical mechanical polishing aqueous dispersion according to the second embodiment includes at least one kind of atoms (hereinafter may be referred to as "metal atoms") (C2) selected from Ta, Ti, and Ru. The concentration of the metal atoms (C2) is $1.0\times10^{-1}$ to $1.0\times10^3$ ppm. If the concentration of the metal atoms (C2) is within the above range, removal of metal atoms dissolved into the chemical mechanical polishing aqueous dispersion due to polishing can be simplified, and the chemical mechanical polishing aqueous dispersion can be recycled. If the concentration of the metal atoms (C2) is more than $1.0\times10^3$ ppm, metal atoms may adhere to the polished interconnect, so that a decrease in yield or the like may occur due to a deterioration in electrical properties of the semiconductor circuit (i.e., polishing target). If the concentration of the metal atoms (C2) is less than $1.0\times10^{-1}$ ppm, it may be very difficult to remove metal atoms to the initial concentration. This may make it difficult to recycle the chemical mechanical polishing aqueous dispersion so that the chemical mechanical polishing aqueous dispersion has a polishing performance almost equal to the initial polishing performance.

At least one kind of metal atoms selected from Ta, Ti, and Ru that is included in the chemical mechanical polishing aqueous dispersion according to the second embodiment is preferably the same as metal atoms included in the polishing target barrier metal film. The chemical mechanical polishing aqueous dispersion according to the second embodiment may include two or more kind of metal atoms selected from Ta, Ti, and Ru in addition to metal atoms included in the polishing target barrier metal film.

For example, when the barrier metal film is a Ta film or a TaN film, the chemical mechanical polishing aqueous dispersion according to the second embodiment preferably includes at least Ta. When the barrier metal film is a Ti film or a TiN film, the chemical mechanical polishing aqueous dispersion according to the second embodiment preferably includes at least Ti. When the barrier metal film is an Ru film, an RuOx film, or an RuNx film, the chemical mechanical polishing aqueous dispersion according to the second embodiment preferably includes at least Ru. If the chemical mechanical polishing aqueous dispersion includes the same kind of metal atoms as the metal atoms included in the barrier metal film, a change in Ta, Ti, or Ru atom concentration in the chemical mechanical polishing aqueous dispersion when polishing the barrier metal film can be controlled, so that a stable polishing performance can be maintained. For example, when the concentration of at least one kind of metal atoms selected from Ta, Ti, and Ru in the chemical mechanical polishing aqueous dispersion before polishing a barrier metal film is 100 mass %, an increase in Ta, Ti, or Ru atom concentration in the chemical mechanical polishing aqueous dispersion due to polishing can be controlled within the range of 1 to 10 mass %, preferably 1.5 to 8 mass %, and more preferably 2 to 5 mass %, so that a change in polishing performance of the chemical mechanical polishing aqueous dispersion can be controlled during polishing.

A preferable concentration of the metal atoms (C2) in the chemical mechanical polishing aqueous dispersion according to the second embodiment may be specified as follows depending on the application of the chemical mechanical polishing aqueous dispersion.

(1) First Application

When the chemical mechanical polishing aqueous dispersion is used to chemically and mechanically polish a barrier metal film that is formed on a semiconductor substrate (e.g., silicon wafer) and includes at least one metal selected from Ta, Ti, and Rb, and is recycled after removing metal atoms that have been dissolved into the chemical mechanical polishing aqueous dispersion due to polishing, the concentration of the metal atoms (C2) is preferably $1 \times 10^{-1}$ to $1 \times 10^2$ ppm, more preferably $1 \times 10^0$ to $8 \times 10^1$ ppm, and particularly preferably $5 \times 10^0$ to $4 \times 10^1$ ppm. If the concentration of the metal atoms (C2) in the chemical mechanical polishing aqueous dispersion used for the first application is within the above range, metal atoms dissolved into the chemical mechanical polishing aqueous dispersion can be removed by a simple operation (described later), so that the chemical mechanical polishing aqueous dispersion can be recycled. If the concentration of the metal atoms (C2) in the chemical mechanical polishing aqueous dispersion is more than $1 \times 10^2$ ppm, metal atoms may adhere to the polished interconnect, so that a decrease in yield or the like may occur due to a deterioration in electrical properties of the semiconductor circuit (i.e., polishing target) (i.e., the polishing performance may deteriorate). If the concentration of the metal atoms (C2) is less than $1.0 \times 10^{-1}$ ppm, it may be very difficult to remove metal atoms to the initial concentration. This may make it difficult to recycle the chemical mechanical polishing aqueous dispersion so that the chemical mechanical polishing aqueous dispersion has a polishing performance almost equal to the initial polishing performance.

(2) Second Application

When the chemical mechanical polishing aqueous dispersion is used to chemically and mechanically polish a barrier metal film that is formed on an electro-optical display substrate and includes at least one metal selected from Ta, Ti, and Rb, the concentration of the metal atoms (C2) is preferably $1 \times 10^1$ to $1 \times 10^3$ ppm, more preferably $5 \times 10^1$ to $8 \times 10^2$ ppm, and particularly preferably $1 \times 10^2$ to $5 \times 10^2$ ppm. If the concentration of the metal atoms (C2) in the chemical mechanical polishing aqueous dispersion used for the second application is within the above range, a change in metal atom concentration in the chemical mechanical polishing aqueous dispersion due to chemical mechanical polishing can be controlled, so that the polishing performance can be stabilized during polishing. If the concentration of the metal atoms (C2) in the chemical mechanical polishing aqueous dispersion is more than $1 \times 10^3$ ppm, metal atoms may adhere to the polished interconnect, so that a decrease in yield or the like may occur due to a deterioration in electrical properties of the semiconductor circuit (i.e., polishing target) (i.e., the polishing performance may deteriorate). Moreover, a change in metal atom concentration in the chemical mechanical polishing aqueous dispersion due to chemical mechanical polishing may increase, so that the polishing performance may not be stabilized during polishing.

Note that the concentration of the metal atoms (C2) in the chemical mechanical polishing aqueous dispersion according to the second embodiment refers to the weight ratio of the metal atoms (C2) to the total weight of the chemical mechanical polishing aqueous dispersion. The concentration of the metal atoms (C2) may be determined by atomic absorption analysis, total-reflection X-ray fluorescence analysis, or the like.

The chemical mechanical polishing aqueous dispersion according to the second embodiment includes the metal atoms (C2) at the above concentration before use (i.e., differs from a chemical mechanical polishing aqueous dispersion in which metal atoms are incorporated during polishing).

The chemical mechanical polishing aqueous dispersion according to the second embodiment may include the metal atoms (C2) as a water-soluble inorganic salt or a salt with an organic acid. Examples of the water-soluble inorganic salt include a sulfate, a chloride salt, a nitrate, and the like. The salt with an organic acid is preferably a salt or a complex with the organic acid (B). If the chemical mechanical polishing aqueous dispersion includes the organic acid (B) and the metal atoms (C2) as a salt with the organic acid (B), metal atoms dissolved into the chemical mechanical polishing aqueous dispersion due to polishing have the same chemical properties as those of the salt with the organic acid (B). Therefore, the polishing performance of the chemical mechanical polishing aqueous dispersion does not change even if metal atoms are not sufficiently removed when recycling the chemical mechanical polishing aqueous dispersion.

1.3 Additive 1.3.1 Surfactant (D)

The chemical mechanical polishing aqueous dispersion according to the first or second embodiment may further include (D) a surfactant. Examples of the surfactant (D) include a nonionic surfactant, an anionic surfactant, a cationic surfactant, and the like.

Examples of the nonionic surfactant include a polyethylene glycol-type nonionic surfactant, a nonionic surfactant having a triple bond, and the like. Examples of the polyethylene glycol-type nonionic surfactant include polyoxyethylene alkyl ethers, polyoxypropylene alkyl ethers, polyoxyalkylene alkyl ethers, and the like. Examples of the nonionic surfactant having a triple bond include acetylene glycol, an acetylene glycol ethylene oxide adduct, acetylene alcohol, and the like. Further examples of the nonionic surfactant include a silicone surfactant, polyvinyl alcohol, cyclodextrin, polyvinyl methyl ether, hydroxyethylcellulose, and the like.

Examples of the anionic surfactant include an aliphatic soap, sulfate salts, phosphate salts, and the like.

Examples of the cationic surfactant include aliphatic amine salts, aliphatic ammonium salts, and the like. These surfactants may be used either individually or in combination.

The content of the surfactant (D) is preferably 0.01 to 2 mass % based on the total mass of the chemical mechanical polishing aqueous dispersion. If the content of the surfactant (D) is less than 0.01 mass %, dishing, erosion, etc. may not be sufficiently reduced. If the content of the surfactant (D) is more than 2 mass %, a decrease in polishing rate, etc. may occur. Moreover, foaming may not be suppressed.

When the chemical mechanical polishing aqueous dispersion according to the first or second embodiment includes the anionic surfactant, potassium dodecylbenzenesulfonate or ammonium dodecylbenzenesulfonate is preferably used. Potassium dodecylbenzenesulfonate or ammonium dodecylbenzenesulfonate may be prepared by neutralizing dodecylbenzenesulfonic acid with potassium hydroxide or ammonia. The content of potassium dodecylbenzenesulfonate and/or ammonium dodecylbenzenesulfonate is preferably 0.002 to 1 mass %, more preferably 0.005 to 0.5 mass %, and particularly preferably 0.007 to 0.3 mass %, based on the total mass of the chemical mechanical polishing aqueous dispersion. If the content of potassium dodecylbenzenesulfonate and/or ammonium dodecylbenzenesulfonate is more than 1 mass %, the polishing performance (e.g., polishing rate) may decrease. If the content of potassium dodecylbenzenesulfonate and/or ammonium dodecylbenzenesulfonate is less than 0.002 mass %, erosion may not be sufficiently reduced.

An additional surfactant may be used instead of part of potassium dodecylbenzenesulfonate and/or ammonium dodecylbenzenesulfonate. Examples of the additional surfactant include a cationic surfactant, an anionic surfactant, and a nonionic surfactant. Examples of the cationic surfactant include aliphatic amine salts, aliphatic ammonium salts, and the like. Examples of the anionic surfactant include a fatty acid soap, carboxylates (e.g., alkyl ether carboxylates), sulfonates (e.g., alkylbenzenesulfonates, alkylnaphthalenesulfonates, and alpha-olefin sulfonates), sulfate salts (e.g., higher alcohol sulfate salts and alkyl ether sulfates), phosphate salts (e.g., alkyl phosphate salts), and the like. Examples of the nonionic surfactant include ether-type surfactants (e.g., polyoxyethylene alkyl ethers), ether ester-type surfactants (e.g., polyoxyethylene ether of glycerol ester), ester-type surfactants (e.g., polyethylene glycol fatty acid ester, glycerol ester, and sorbitan ester), and the like. The additional surfactant may be used in an amount of less than 10 mass % based on the total amount of potassium dodecylbenzenesulfonate and/or ammonium dodecylbenzenesulfonate and the additional surfactant.

1.3.2 Water-Soluble Polymer (E)

The chemical mechanical polishing aqueous dispersion according to the first or second embodiment may further include (E) a water-soluble polymer. The chemical mechanical polishing aqueous dispersion can be provided with moderate viscosity by adding the water-soluble polymer (E). The viscosity of the chemical mechanical polishing aqueous dispersion may be controlled by changing the type, the weight average molecular weight, and the content of the water-soluble polymer (E). A polishing pressure can be efficiently and uniformly transmitted to the polishing target surface by controlling the viscosity of the chemical mechanical polishing aqueous dispersion.

Examples of the water-soluble polymer (E) include polyacrylic acid, polymethacrylic acid, polymaleic acid, polyvinylsulfonic acid, polyallylsulfonic acid, polystyrenesulfonic acid, and salts thereof; vinyl synthetic polymers such as polyvinyl alcohol, polyoxyethylene, polyvinylpyrrolidone, polyvinylpyridine, polyacrylamide, polyvinylformamide, polyethylenimine, polyvinyloxazoline, and polyvinylimidazole; modified products of natural polysaccharides such as hydroxyethyl cellulose, carboxymethyl cellulose, and modified starch; and the like. These water-soluble polymers may be used either individually or in combination. The polyethylene glycol-reduced weight average molecular weight (Mw) of the water-soluble polymer determined by gel permeation chromatography (GPC) is preferably 50,000 to 5,000,000, and more preferably 500,000 to 2,500,000. If the water-soluble polymer has a weight average molecular weight within the above range, defects (e.g., scratches) of a metal film can be reduced while maintaining a high polishing rate for a metal film and an insulating film. If the weight average molecular weight of the water-soluble polymer is less than 50,000, a metal film or an insulating film may not be polished with high selectivity. If the weight average molecular weight of the water-soluble polymer is too high, a metal film may not be polished at a practical polishing rate. Moreover, the abrasive grains (A) may aggregate in a chemical mechanical polishing aqueous dispersion supply apparatus, and may increase the number of scratches.

The water-soluble polymer (E) may be a homopolymer, or may be a copolymer with two or more monomers. For example, a monomer that includes a carboxyl group, a monomer that includes a sulfonic acid group, a monomer that includes a hydroxyl group, a monomer that includes a polyethylene oxide chain, a monomer that includes an amino group, a monomer that includes a heterocyclic ring, or the like may be used.

Examples of the monomer that includes an amide group include (meth)acrylamide, N-methylolacrylamide, N-2-hydroxyethylacrylamide, acryloylmorpholine, dimethylaminopropylacrylamide, N,N-dimethylacrylamide, N-isopropylacrylamide, N-vinylacetamide, N-vinylformamide, and the like.

Examples of the monomer that includes a carboxyl group include acrylic acid, methacrylic acid, itaconic acid, maleic acid, fumaric acid, and salts thereof These monomers may use as an acid anhydride.

Examples of the monomer that includes a hydroxyl group include vinyl alcohol, allyl alcohol, hydroxyethyl (meth)acrylate, polyethylene glycol mono(meth)acrylate, polypropylene glycol mono(meth)acrylate, vinylglycolic acid, and the like. The alkyl side chain length or the ethylene oxide side chain length is not particularly limited.

Examples of the monomer that includes an amino group include N,N-dimethylaminoethyl (meth)acrylate and the like. The alkyl side chain length is not particularly limited. The monomer that includes an amino group may be converted into a quaternary salt using a cationizing agent.

Examples of the monomer that includes a heterocyclic ring include vinylimidazole, vinylpyrrolidone, vinylpyridine, vinyloxazoline, N-vinyl caprolactam, vinylpyrrole, vinylquinoline, and the like.

A commercially available surfactant that includes a polymerizable double bond and a sulfonic acid group in the molecule may be used as the monomer. Examples of such a commercially available surfactant include Eleminol JS-2 (manufactured by Sanyo Chemical Industries, Ltd.), Latemul ASK (manufactured by Kao Corporation), and the like.

Examples of other monomers include aromatic vinyl compounds such as cyclohexyl (meth)acrylate, styrene, alpha-methylstyrene, vinyltoluene, and p-methyl styrene, aliphatic conjugated dienes such as butadiene, isoprene, 2-chloro-1,3-butadiene, and 1-chloro-1,3-butadiene, vinyl cyanide compounds such as (meth)acrylonitrile, phosphoric acid compounds, and the like. These monomers may be used either individually or in combination.

The content of the water-soluble polymer (E) is preferably 0.005 to 1.2 mass %, more preferably 0.01 to 0.8 mass %, and particularly preferably 0.02 to 0.3 mass %, based on the total mass of the chemical mechanical polishing aqueous dispersion. If the content of the water-soluble polymer is within the above range, dishing of a copper film can be effectively reduced. If the content of the water-soluble polymer is less than 0.005 mass %, the viscosity of the chemical mechanical polishing aqueous dispersion may decrease to a large extent, so that the polishing performance may vary across the surface of a substrate. If the content of the water-soluble polymer is more than 1.2 mass %, a sufficient flatness improvement effect corresponding to the amount of the water-soluble polymer may not be obtained. Moreover, an increase in cost may occur. Furthermore, the polishing rate may decrease, or in-plane uniformity may deteriorate due to an increase in polishing frictional heat caused by an increase in viscosity of the chemical mechanical polishing aqueous dispersion.

The chemical mechanical polishing aqueous dispersion according to the first or second embodiment preferably has a viscosity of less than 10 mPa·s. The viscosity of the chemical mechanical polishing aqueous dispersion may be adjusted by controlling the type, the weight average molecular weight, and the content of the water-soluble polymer (E). If the viscosity of the chemical mechanical polishing aqueous dispersion is 10 mPa·s or more, the chemical mechanical polishing aqueous dispersion may not be stably supplied to abrasive cloth. As a result, an increase in temperature of the abrasive cloth, polishing non-uniformity (deterioration in in-plane uniformity), or the like may occur, so that a metal film and an insulating film may not be polished at a constant polishing rate, or dishing may vary.

When the chemical mechanical polishing aqueous dispersion according to the first or second embodiment includes the water-soluble polymer (E), the mass ratio ((B):(E)) of the organic acid (B) to the water-soluble polymer (E) is preferably 1:0.01 to 1:3, more preferably 1:0.02 to 1:2, and particularly preferably 1:0.05 to 1:1. If the mass ratio ((B):(E)) of the organic acid (B) to the water-soluble polymer (E) is less than 1:0.01, flatness may be impaired due to an increase in chemical etching effect of the organic acid. If the mass ratio ((B):(E)) of the organic acid (B) to the water-soluble polymer (E) is more than 1:3, the polishing rate may decrease to a large extent.

1.3.3 pH Adjusting Agent

The chemical mechanical polishing aqueous dispersion according to the first or second embodiment may further include a pH adjusting agent. Examples of the pH adjusting agent include organic acids, basic compounds, and the like. Examples of organic acids that may be used as the pH adjusting agent include an amino acid, formic acid, lactic acid, acetic acid, tartaric acid, fumaric acid, glycolic acid, phthalic acid, maleic acid, oxalic acid, citric acid, malic acid, anthranilic acid, malonic acid, glutaric acid, an organic acid that includes a heterocyclic six-membered ring that includes at least one N atom, and an organic acid that includes a heterocyclic five-membered ring (heterocyclic compound). Specific examples of the organic acids include quinaldic acid, quinolinic acid, 8-quinolinol, 8-aminoquinoline, quinoline-8-carboxylic acid, 2-pyridinecarboxylic acid, xanthurenic acid, kynurenic acid, benzotriazole, benzimidazole, 7-hydroxy-5-methyl-1,3,4-triazaindolizine, nicotinic acid, picolinic acid, glycine, alanine, phenylalanine, histidine, cysteine, methionine, glutamic acid, aspartic acid, tryptophan, and the like.

The content of the organic acid that may be used as the pH adjusting agent is preferably 0.001 to 2.0 mass %, and more preferably 0.01 to 1.5 mass %, based on the total mass of the chemical mechanical polishing aqueous dispersion. If the content of the organic acid is less than 0.001 mass %, Cu dishing may occur to a large extent. If the content of the organic acid is more than 2.0 mass %, a stable chemical mechanical polishing aqueous dispersion may not be produced due to precipitation or separation of the abrasive grains (A).

Examples of basic compounds that may be used as the pH adjusting agent include an organic base and an inorganic base. Examples of the organic base include ethylenediamine, ethanolamine, tetramethylammonium hydroxide (TMAH), and the like. Examples of the inorganic base include ammonia, potassium hydroxide, ammonium sulfate, ammonium nitrate, and the like. These bases may be used either individually or in combination.

The content of the base is 10 mass % or less, and preferably 0.001 to 8 mass %, based on the total mass of the chemical mechanical polishing aqueous dispersion. If the content of the base is 10 mass % or less, a stable aqueous dispersion that exhibits excellent dispersibility can be obtained.

The chemical mechanical polishing aqueous dispersion can be maintained at an optimum pH by adding the pH adjusting agent. The pH of the chemical mechanical polishing aqueous dispersion may be appropriately adjusted depending on the type of polishing target film. For example, when polishing a low-dielectric-constant insulating film that is a porous film having a dielectric constant of 2.0 to 2.5, the pH of the chemical mechanical polishing aqueous dispersion is preferably 7 to 11, and more preferably 8 to 10.

1.3.4 Oxidizing Agent

The chemical mechanical polishing aqueous dispersion according to the first or second embodiment may further include an oxidizing agent. An appropriate oxidizing agent may be selected depending on the electrochemical properties, etc., of the polishing target metal film using a Pourbaix diagram or the like. Examples of the oxidizing agent include ammonium persulfate, potassium persulfate, hydrogen peroxide, ferric nitrate, cerium diammonium nitrate, iron sulfate, ozone, potassium periodate, peracetic acid, and the like. These oxidizing agents may be used either individually or in combination. Among these oxidizing agents, it is particularly preferable to use hydrogen peroxide, an organic peroxide, or a persulfate (e.g., ammonium persulfate) since the decomposition product thereof does not have toxicity. It is particularly preferable to use hydrogen peroxide from the viewpoint of oxidizing power and ease of recycling.

The content of the oxidizing agent is preferably 0.01 to 9 mass %, more preferably 0.01 to 5 mass %, still more preferably 0.02 to 6 mass %, and particularly preferably 0.05 to 2 mass %, based on the total mass of the chemical mechanical polishing aqueous dispersion. If the content of the oxidizing agent is less than 0.01 mass %, the surface of a copper film may not be sufficiently oxidized, so that a sufficient polishing rate may not be achieved. If the content of the oxidizing agent is more than 9 mass %, corrosion or dishing of a copper film may occur to a large extent.

2. Method of Recycling Chemical Mechanical Polishing Aqueous Dispersion

2.1 Third Embodiment

A method of recycling a chemical mechanical polishing aqueous dispersion according to a third embodiment is a method of recycling a chemical mechanical polishing aqueous dispersion by utilizing a liquid waste that is discharged after polishing an interconnect layer that includes copper or copper alloy by using the chemical mechanical polishing aqueous dispersion, the chemical mechanical polishing aqueous dispersion including at least (A) abrasive grains, (B) an organic acid, and (C1) copper ions, the chemical mechanical polishing aqueous dispersion including the copper ions (C1) at a concentration of $1\times10^1$ to $2\times10^5$ ppm, the method including (a) collecting the liquid waste, and (b) removing coarse particles from the liquid waste.

The method of recycling a chemical mechanical polishing aqueous dispersion according to the third embodiment is used for the chemical mechanical polishing aqueous dispersion according to the first embodiment. Each step of the method of recycling a chemical mechanical polishing aqueous dispersion according to the third embodiment is described in detail below.

2.1.1 Step (a)

The step (a) may be performed by an arbitrary method insofar as the dispersibility of the abrasive grains (A) is not affected. For example, a line that collects the chemical mechanical polishing aqueous dispersion after polishing may be provided in an apparatus, and the chemical mechanical polishing aqueous dispersion may be collected into a buffer tank, as disclosed in JP-A-11-10540 or JP-A-11-277434.

2.1.2 Step (b)

The step (b) may be performed by an arbitrary method insofar as the concentrations of the abrasive grains (A), the organic acid (B), and the copper ions (C1) in the collected chemical mechanical polishing aqueous dispersion are not affected. The expression "the concentration of the abrasive grains (A) is not affected" used herein means that, when the content of the abrasive grains (A) before performing the step (b) is 100 mass %, the content of the abrasive grains (A) after performing the step (b) is 80 to 100 mass %, preferably, 90 to 99 mass %, and most preferably 95 to 98 mass %. The expression "the concentration of the organic acid (B) is not affected" used herein means that, when the content of the organic acid (B) before performing the step (b) is 100 mass %, the content of the organic acid (B) after performing the step (b) is 80 to 100 mass %, preferably, 90 to 99 mass %, and most preferably 95 to 98 mass %. The expression "the concentration of the copper ions (C1) is not affected" used herein means that, when the content of the copper ions (C1) before performing the step (b) is 100 mass %, the content of the copper ions (C1) after performing the step (b) is 80 to 100 mass %, preferably, 90 to 99 mass %, and most preferably 95 to 98 mass %.

For example, the step (b) may be performed by removing coarse particles and polishing waste using a mesh or filter. For example, the method disclosed in JP-A-11-10540 or JP-A-11-277434 may be used.

The method of recycling a chemical mechanical polishing aqueous dispersion according to the third embodiment enables recycling of the chemical mechanical polishing aqueous dispersion by very simple steps (a) and (b), as described above.

2.2 Fourth Embodiment

A method of recycling a chemical mechanical polishing aqueous dispersion according to a fourth embodiment is a method of recycling a chemical mechanical polishing aqueous dispersion by utilizing a liquid waste that is discharged after polishing a barrier metal film that includes at least one metal selected from Ta, Ti, and Rb by using the chemical mechanical polishing aqueous dispersion, the chemical mechanical polishing aqueous dispersion including at least (A) abrasive grains, (B) an organic acid, and (C2) at least one kind of metal atoms selected from Ta, Ti, and Rb, the chemical mechanical polishing aqueous dispersion including the at least one kind of metal atoms (C2) selected from Ta, Ti, and Rb at a concentration of $1\times10^{-1}$ to $1\times10^3$ ppm, the method including (a) collecting the liquid waste, and (b) removing coarse particles from the liquid waste.

The method of recycling a chemical mechanical polishing aqueous dispersion according to the fourth embodiment is used for the chemical mechanical polishing aqueous dispersion according to the second embodiment. Each step of the method of recycling a chemical mechanical polishing aqueous dispersion according to the fourth embodiment may be implemented in the same manner as in the third embodiment, except that the copper ions (C1) are replaced by at least one kind of metal atoms (C2) selected from Ta, Ti, and Rb. Therefore, further description is omitted.

3. Chemical Mechanical Polishing Method

3.1 Semiconductor Substrate

A chemical mechanical polishing method according to one embodiment of the invention is described in detail below with reference to the drawings. FIGS. 1 and 2 are cross-sectional views schematically illustrating a step of the chemical mechanical polishing method according to this embodiment.

The chemical mechanical polishing method according to this embodiment chemically and mechanically polishes a metal film formed on the surface of a circuit board on which a metal interconnect is formed, the circuit board including a substrate that includes a groove, and a metal material that is provided in the groove and forms the metal interconnect (see FIGS. 1C and 2C), the method including polishing the metal film while supplying the above chemical mechanical polishing aqueous dispersion. As shown in FIG. 2, a barrier metal film may optionally be formed on the bottom and the inner wall surface of the groove and the surface of the substrate in which the groove is formed.

Examples of the circuit board on which the metal film is formed include an unpolished semiconductor substrate that is used when producing a semiconductor device (e.g., very large scale integration (VLSI)).

Examples of the metal that forms the metal interconnect and the metal film include pure metals such as pure tungsten, pure aluminum, and pure copper; and alloys of tungsten, aluminum, or copper and another metal. The material that forms the non-interconnect area is not particularly limited insofar as the material has insulating properties. For example, silicon oxide, an insulating resin, or the like may be used. Examples of the metal that forms the barrier metal film include tantalum, titanium, tantalum nitride, titanium nitride, and the like.

A commercially available chemical mechanical polishing apparatus (e.g., "EPO-112", "EPO-222" (manufactured by Ebara Corporation), "LGP510", "LGP552" (manufactured by Lapmaster SFT Corporation), or "Mirra" (manufactured by Applied Materials, Inc.)) may be used as the polishing apparatus.

The chemical mechanical polishing method according to the invention is described in detail below with reference to the drawings. Note that the chemical mechanical polishing method is not limited to the following example. A metal film 4 is formed on the surface of a circuit board on which a metal interconnect is formed (see FIG. 1A or 2A). As shown in FIG. 1C or 2C, the circuit board includes a substrate 2 that includes a groove, and a metal material 1 that is provided in the groove and forms the metal interconnect.

Figure 1B:
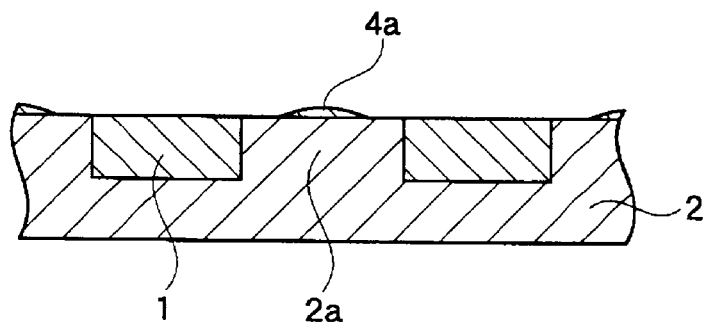
FIG. 1B is a cross-sectional view schematically illustrating a step of a chemical mechanical polishing method according to one embodiment of the invention.
Figure 1C:
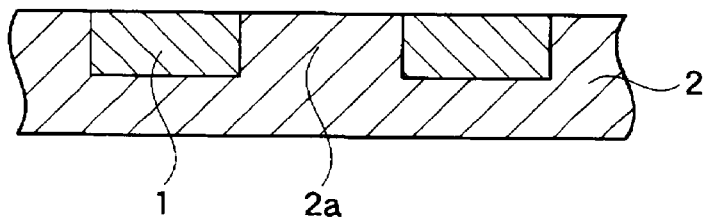
FIG. 1C is a cross-sectional view schematically illustrating a step of a chemical mechanical polishing method according to one embodiment of the invention.
Figure 2A:
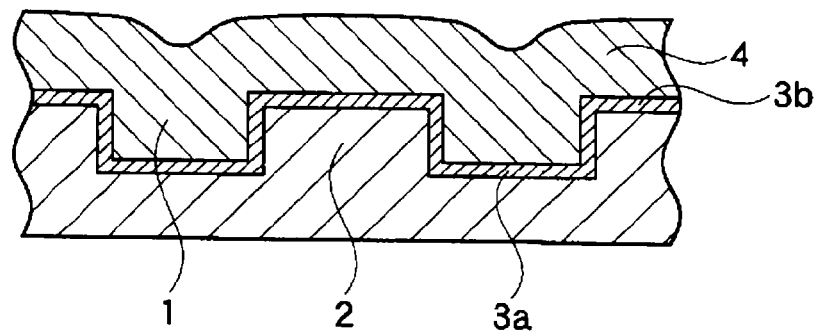
FIG. 2A is a cross-sectional view schematically illustrating a step of a chemical mechanical polishing method according to one embodiment of the invention.

The circuit board material shown in FIG. 1A or 2A is installed in a polishing apparatus, and the metal film 4 is polished while supplying the chemical mechanical polishing aqueous dispersion according to the first embodiment. The metal film 4 is polished until a layer other than the metal film 4 is exposed in a non-interconnect area 2a of the circuit board other than the metal interconnect 1 (endpoint (see FIG. 1B or 2B)). The layer other than the metal film 4 is a substrate 2a or a barrier metal film 3b. The endpoint may be determined by detecting a change in torque by measuring a current supplied to a motor during polishing, or may be determined by an eddy current method, or may be determined by optically detecting a change in color of the polishing target surface.

The polishing conditions (e.g., type of polishing pad, carrier load, carrier rotational speed, platen rotational speed, and aqueous dispersion flow rate) are appropriately determined depending on the material of the polishing target metal film.

Figure 2B:
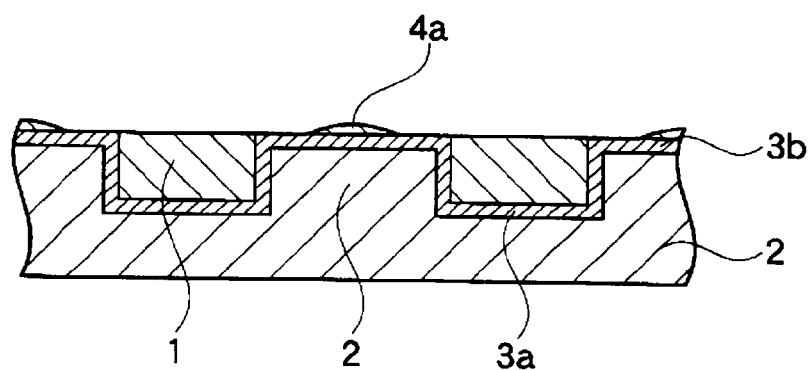
FIG. 2B is a cross-sectional view schematically illustrating a step of a chemical mechanical polishing method according to one embodiment of the invention.
Figure 2C:
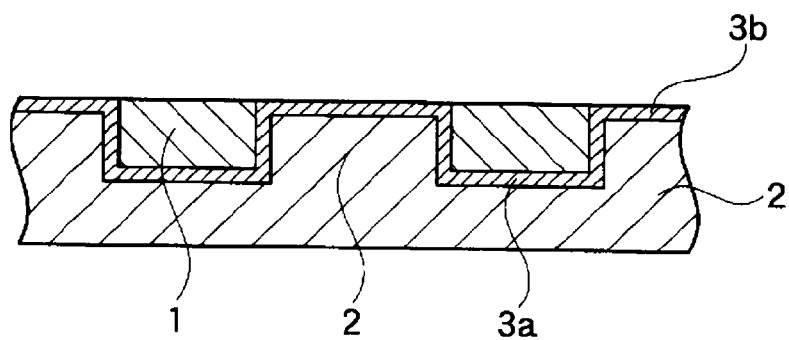
FIG. 2C is a cross-sectional view schematically illustrating a step of a chemical mechanical polishing method according to one embodiment of the invention.

When polishing the metal film 4 to the endpoint using only the chemical mechanical polishing aqueous dispersion according to the first embodiment, part of the metal film may remain in the non-interconnect area (see FIG. 1B or 2B). Therefore, the remaining metal film 4a is removed by over-polishing the polishing target for a given time while supplying the chemical mechanical polishing aqueous dispersion according to the first embodiment or a chemical mechanical polishing aqueous composition having a polishing rate ratio different from that of the chemical mechanical polishing aqueous dispersion according to the first embodiment. The over-polishing time is appropriately determined experimentally, but is preferably 0 to 50% of the polishing time until the endpoint is reached. The polishing conditions (e.g., type of polishing pad, carrier load, carrier rotational speed, platen rotational speed, and flow rate of chemical mechanical polishing aqueous dispersion) are appropriately determined depending on the material of the polishing target metal film. The flow rate of the chemical mechanical polishing aqueous dispersion during over-polishing is preferably equal to or less than the flow rate of the chemical mechanical polishing aqueous dispersion during polishing until the endpoint is reached.

After polishing the metal film, it is preferable to remove the abrasive grains that remain on the surface of the circuit board by a normal washing (cleaning) method or the like.

The progress of dishing and copper residues can be prevented by over-polishing the polishing target while supplying the chemical mechanical polishing aqueous dispersion according to the first embodiment or a chemical mechanical polishing aqueous composition having a polishing rate ratio different from that of the chemical mechanical polishing aqueous dispersion according to the first embodiment after polishing the polishing target while supplying only the chemical mechanical polishing aqueous dispersion until the substrate or the barrier metal film is exposed. The chemical mechanical polishing method according to the invention can produce a flat and high-quality metal circuit board that is free from corrosion.

3.2 Electro-Optical Display Substrate

A chemical mechanical polishing method according to one embodiment of the invention that is applied to an electro-optical display substrate may be divided into a first step that mainly polishes an interconnect layer, and a second step that mainly polishes a barrier metal film. The chemical mechanical polishing aqueous dispersion according to the first embodiment may be applied to the first step that polishes the interconnect layer that is formed of copper or a copper alloy. The chemical mechanical polishing aqueous dispersion according to the second embodiment may be applied to the second step that polishes the barrier metal film.

The chemical mechanical polishing method according to this embodiment is described in detail below with reference to the drawings. FIG. 3 is a cross-sectional view of an electro-optical display substrate schematically illustrating a step of the chemical mechanical polishing method according to this embodiment.

Examples of the substrate subjected to the chemical mechanical polishing method according to this embodiment include a glass substrate, a film substrate, and a plastic substrate. The substrate may have a diagonal dimension of 1500 to 3000 mm, for example. The substrate may be a single-layer substrate, or may be a laminate that includes a substrate and an insulating film formed on the substrate (e.g., silicon substrate).

Figure 3A:
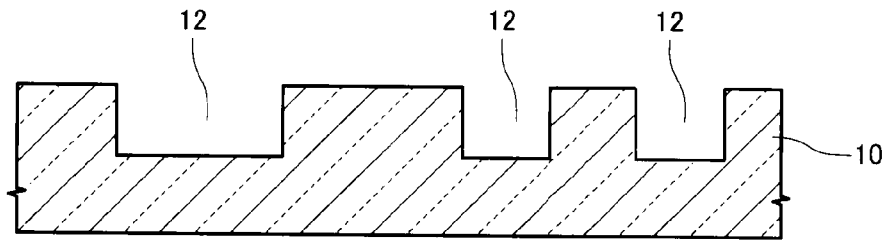
FIG. 3A is a cross-sectional view of an electro-optical display substrate schematically illustrating a step of a chemical mechanical polishing method according to one embodiment of the invention.

(1) As shown in FIG. 3A, a glass substrate 10 is provided, for example. A depression 12 for forming an interconnect is formed in the glass substrate 10. The depression 12 may be formed in the glass substrate 10 by dry etching. The term "dry etching" refers to a method that applies accelerated ions to the glass substrate to physically process the glass substrate. A fine pattern can be formed by accurately controlling the beam applied. The glass substrate 10 may be formed of soda lime glass, borosilicate glass, aluminosilicate glass, or quartz glass, for example.

Figure 3B:
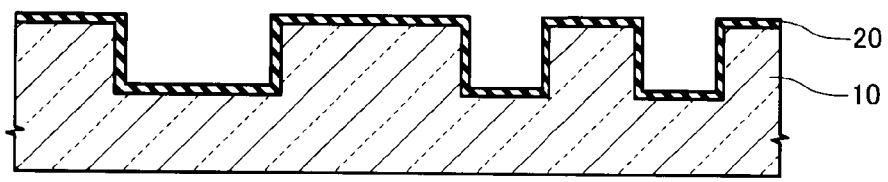
FIG. 3B is a cross-sectional view of an electro-optical display substrate schematically illustrating a step of a chemical mechanical polishing method according to one embodiment of the invention.

(2) As shown in FIG. 3B, a barrier metal film 20 is formed to cover the surface of the glass substrate 10 and the bottom and the inner wall surface of the depression 12. The barrier metal film 20 may be formed of Ta or TaN, for example. The barrier metal film 20 is deposited by chemical vapor deposition (CVD).

Figure 3C:
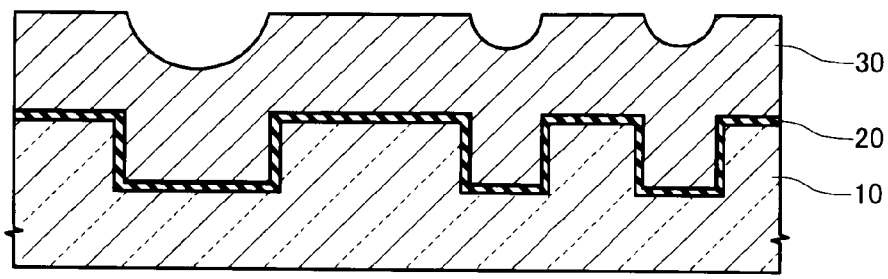
FIG. 3C is a cross-sectional view of an electro-optical display substrate schematically illustrating a step of a chemical mechanical polishing method according to one embodiment of the invention.

(3) As shown in FIG. 3C, an interconnect metal is deposited to cover the surface of the barrier metal film 20 to form a metal film 30. The metal film 30 may be formed of copper or a copper alloy. The metal film 30 may be deposited by physical vapor deposition (PVD) such as sputtering or vacuum deposition.

Figure 3D:
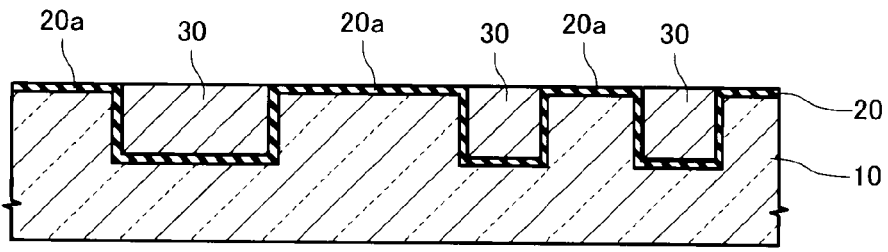
FIG. 3D is a cross-sectional view of an electro-optical display substrate schematically illustrating a step of a chemical mechanical polishing method according to one embodiment of the invention.

(4) As shown in FIG. 3D, unnecessary metal film 30 in an area other than the area buried in the depression 12 is removed by chemical mechanical polishing using the chemical mechanical polishing aqueous dispersion according to the first embodiment. The above operation is repeated until the barrier metal film 20 is exposed. It is preferable to remove the abrasive grains that remain on the polishing target surface after chemical mechanical polishing. The abrasive grains may be removed by a normal washing (cleaning) method.

Figure 3E:
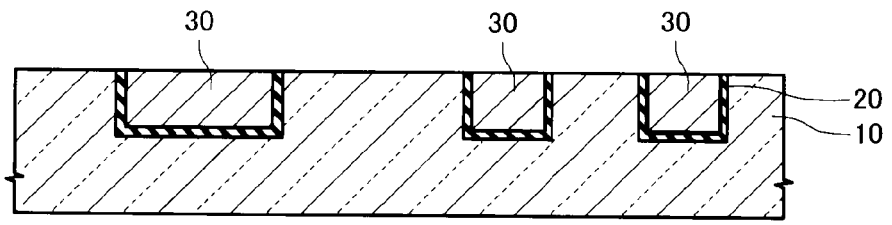
FIG. 3E is a cross-sectional view of an electro-optical display substrate schematically illustrating a step of a chemical mechanical polishing method according to one embodiment of the invention.

(5) As shown in FIG. 3E, the barrier metal film 20a formed in an area other than the depression 12 and the surface of the glass substrate 10 are removed by chemical mechanical polishing using the chemical mechanical polishing aqueous dispersion according to the second embodiment.

A fine electro-optical display substrate that exhibits excellent in-plane flatness is thus obtained.

4. Examples

The invention is further described below by way of examples. Note that the invention is not limited to the following examples. In the examples and comparative examples, the units "parts" and "%" respectively refer to "parts by mass" and "mass %" unless otherwise indicated.

4.1 Preparation of Silica Particle Aqueous Dispersion

4.1.1 Preparation of Fumed Silica Particle Aqueous Dispersion 100 parts by mass of fumed silica particles ("Aerosil 90G" manufactured by Nippon Aerosil Co., Ltd.) were dispersed in 900 parts by mass of ion-exchanged water using an ultrasonic disperser, and filtered through a filter having a pore diameter of 5 micrometers to prepare a fumed silica aqueous dispersion (1) containing 10 mass % of fumed silica particles.

4.1.2 Preparation of Colloidal Silica Aqueous Dispersion

A flask was charged with 70 parts by mass of 25 mass % aqueous ammonia, 40 parts by mass of ion-exchanged water, 170 parts by mass of ethanol, and 20 parts by mass of tetraethoxysilane. The mixture was heated to 60° C. with stirring at a rotational speed of 180 rpm. The mixture was stirred at 60° C. for two hours to obtain a colloidal silica particle alcohol dispersion.

After the addition of ion-exchanged water, the alcohol component was removed using a rotary evaporator to obtain a colloidal silica aqueous dispersion (2) containing 10 mass % of colloidal silica particles. The average primary particle diameter of the colloidal silica particles contained in the aqueous dispersion determined using a scanning electron microscope was 30 nm. The average secondary particle diameter of the colloidal silica particles determined using laser diffractometry using a dynamic light scattering particle size analyzer ("HORIBA LB550" manufactured by Horiba Ltd.) was 65 nm.

4.2 Preparation of Polyacrylic Acid Aqueous Solution

A vessel (internal volume: 2 l) was charged with 1000 g of ion-exchanged water and 1 g of a 5 mass % ammonium persulfate aqueous solution. 500 g of a 20 mass % acrylic acid aqueous solution was evenly added dropwise to the mixture over eight hours under reflux with stirring. After the addition, the mixture was allowed to stand for two hours under reflux to obtain an aqueous solution containing polyacrylic acid having a weight average molecular weight (Mw) of 1,100,000.

The aqueous solution was neutralized by slowly adding a 10 mass % potassium hydroxide aqueous solution to prepare an aqueous solution (pH: 7.5) containing 10 mass % of polyacrylate (potassium polyacrylate having a weight average molecular weight (Mw) of 1,100,000. The weight average molecular weight (PEG-reduced molecular weight) was measured by gel permeation chromatography (instrument: "LC module 1" manufactured by Waters, detector: "410 differential refractometer" manufactured by Waters).

4.3 Preparation of Chemical Mechanical Polishing Aqueous Dispersion

4.3.1 Example 1

A polyethylene bottle was charged with the fumed silica aqueous dispersion (1) (solid content: 1.2 mass %). After the addition of an organic acid (B), copper ions (C1), a surfactant, and a 30 mass % hydrogen peroxide solution (see Table 1), the mixture was sufficiently stirred. The copper ion concentration shown in Table 1 was achieved by adding a 10% copper nitrate aqueous solution. The pH of the chemical mechanical polishing aqueous dispersion was adjusted to 9 by adding aqueous ammonia with stirring. After the addition of ion-exchanged water so that the total amount of the components was 100 mass %, the mixture was stirred for one hour. The mixture was then filtered through a filter having a pore size of 5 micrometers to obtain a chemical mechanical polishing aqueous dispersion of Example 1. It was confirmed that the copper ion concentration in the chemical mechanical polishing aqueous dispersion determined by an atomic absorption method was $6 \times 10^2$ ppm.

4.3.2 Examples 2 to 8, Comparative Examples 1 to 4, and Reference Examples 1 to 3

A chemical mechanical polishing aqueous dispersion of each example having a composition shown in Tables 1 to 3 was prepared in the same manner as in the section entitled "4.3.1 Example 1" In Example 5, the pH of the chemical mechanical polishing aqueous dispersion was adjusted by adding a 48 mass % potassium hydroxide aqueous solution.

4.3.3 Example 9

A polyethylene bottle was charged with the fumed silica aqueous dispersion (1) (solid content: 1.2 mass %). After the addition of an organic acid (B), at least one atom (C2) selected from Ta, Ti, and Ru, additives, and a 30 mass % hydrogen peroxide solution (see Table 4), the mixture was sufficiently stirred. The Ta concentration shown in Table 4 was achieved by adding a Ta-containing dispersion prepared by adding 0.1 g of tantalum pentaethoxide (manufactured by Kojundo Chemical Lab. Co., Ltd.) dropwise to 1 kg of vigorously stirred purified water over one hour. The Ru concentration shown in Table 4 was achieved by adding a 1% ruthenium nitrate aqueous solution. The pH of the chemical mechanical polishing aqueous dispersion was adjusted to 9 by adding aqueous ammonia with stirring. After the addition of ion-exchanged water so that the total amount of the components was 100 mass %, the mixture was stirred for one hour. The mixture was then filtered through a filter having a pore size of 5 micrometers to obtain a chemical mechanical polishing aqueous dispersion of Example 9. It was confirmed that the Ta atom concentration and the Ru atom concentration in the chemical mechanical polishing aqueous dispersion determined by an atomic absorption method were $2 \times 10^1$ ppm and $4 \times 10^1$ ppm.

4.3.4 Examples 10 to 14 and Comparative Examples 5 to 10

A chemical mechanical polishing aqueous dispersion of each example having a composition shown in Tables 4 and 5 was prepared in the same manner as in the section entitled "4.3.3 Example 9". The Ti concentration shown in Table 4 or 5 was achieved by adding a Ti-containing dispersion prepared by adding 1 g of titanium tetraethoxide (manufactured by Kojundo Chemical Lab. Co., Ltd.) dropwise to 1 kg of vigorously stirred purified water over one hour.

4.4 Test Example 1

4.4.1 Evaluation of Copper Film Polishing Rate

A porous polyurethane polishing pad ("IC" manufactured by Rohm and Haas) was installed in a chemical mechanical polishing apparatus ("MIRRA-Mesa" manufactured by Applied Materials, Inc.,). A polishing rate measurement substrate was polished for one minute under the following polishing conditions while supplying the chemical mechanical polishing aqueous dispersion prepared as described in the section entitled "4.3 Preparation of chemical mechanical polishing aqueous dispersion". The copper film polishing rate was calculated by the following method. The copper film polishing rate is preferably 800 nm/min or more, and more preferably 1000 nm/min or more.

(a) Polishing Rate Measurement Substrate 8-inch silicon substrate with thermal oxide film on which a copper film having a thickness of 1500 nm was formed (b) Polishing Conditions Polishing pad: "IC 1000" manufactured by Rodel Head load: 200 g/cm$^2$ Head rotational speed: 80 rpm Platen rotational speed: 100 rpm Dispersion supply rate: 200 ml/min (c) Calculation of Polishing Rate The sheet resistance was measured after polishing by a direct-current four-point probe method using a resistivity meter ("S-5" manufactured by NPS Inc.). The thickness of the polished metal film was calculated by the following expression (1). The polishing rate was calculated from a reduction in thickness due to chemical mechanical polishing and the endpoint time.

Thickness of metal film (angstroms)=sheet resistance (ohm/cm$^2$)÷theoretical resistance of metal (ohm/cm)×10$^{-8}$ (1)

4.4.2 Evaluation of Copper Film Polishing Performance

A patterned wafer (test substrate manufactured by SEMATECH INTERNATIONAL produced by depositing a silicon nitride film (1000 angstroms) on a silicon substrate, depositing a PETEOS film (5000 angstroms) on the silicon nitride film, forming a SEMATECH854 mask pattern, and sequentially depositing a tantalum film (250 angstroms), a copper seed film (1000 angstroms), and a copper plating film (10,000 angstroms) (the cross-section of the substrate is schematically shown in FIG. 2A) was subjected to chemical mechanical polishing in the same manner as described in the section entitled "4.4.1 Evaluation of copper film polishing rate", except that polishing was terminated when the tantalum film was detected (exposed) on the polishing target surface. A copper residue on the fine interconnect pattern and erosion of the copper interconnect were evaluated by the following method.

(a) Evaluation of Erosion

The amount of erosion of the center of the interconnect with respect to each end in an area in which a pattern (i.e., a copper interconnect area with a width of 9 micrometers and an insulating area with a width of 1 micrometer were alternately provided) was continuously formed to a length of 1.25 mm in the longitudinal direction was measured using a precise step meter ("HRP-240" manufactured by KLA-Tencor Corporation). The amount of erosion is preferably 500 nm or less, and more preferably 250 nm or less.

Tables 1 and 2 show the composition of the chemical mechanical polishing aqueous dispersions of Examples 1 to 6, Comparative Examples 1 to 3, and Reference Examples 1 to 3, the copper film polishing rate, and the polishing performance evaluation results.

4.4.3 Evaluation of Polishing Performance of Recycled Chemical Mechanical Polishing Aqueous Dispersion (a) Chemical Mechanical Polishing Aqueous Dispersion Recycling Method 1

In Examples 1 to 3, Comparative Examples 1 to 2, and Reference Example 1, the chemical mechanical polishing aqueous dispersion used as described in the section entitled "4.4.1 Evaluation of copper film polishing rate" was collected, and centrifuged (maximum centrifugal acceleration: 1000 G, rotation time: 10 min) using a high-speed refrigerated centrifuge "CR22E" and a continuous rotor "R18C" (manufactured by Hitachi-Koki, Ltd.) to precipitate and collect the abrasive grains. The abrasive grains thus collected were used without drying. The abrasive grains (A), organic acid (B), additives, 30 mass % hydrogen peroxide solution, and copper ions (C) were added at a concentration shown in Table 1 on the assumption that all of the abrasive grains had been collected (total mass of chemical mechanical polishing aqueous dispersion=100 mass %). The mixture was then sufficiently stirred. The copper ion concentration shown in Table 1 was achieved by adding a 10% copper nitrate aqueous solution. The pH of the chemical mechanical polishing aqueous dispersion was adjusted to 9 by adding aqueous ammonia with stirring. After the addition of ion-exchanged water so that the total amount of the components was 100 mass %, the mixture was stirred for one hour. The mixture was then filtered through a filter having a pore size of 10 micrometers. The polishing performance of the chemical mechanical polishing aqueous dispersion was evaluated in the same manner as described above. The results are shown in Table 1 ("recycle polishing results").

TABLE 1

|  |  | Example 1 | Example 2 | Example 3 | Comparative Example 1 | Comparative Example 2 | Reference Example 1 |
| --- | --- | --- | --- | --- | --- | --- | --- |
| Abrasive grains (A) | Type | Aqueous dispersion (1) | Aqueous dispersion (2) | Aqueous dispersion (2) | Aqueous dispersion (1) | Aqueous dispersion (2) | Aqueous dispersion (2) |
|  | Content (mass %) | 1.2 | 2.0 | 2.0 | 1.2 | 2.0 | 0.05 |
| Organic acid (B) | Type | Glycine | Aniline | Glycine | Glycine | — | Quinolinic acid |
|  | Content (mass %) | 4.0 | 3.5 | 2.0 | 0.01 | — | 1.2 |

TABLE 1-continued

|  |  | Example 1 | Example 2 | Example 3 | Comparative Example 1 | Comparative Example 2 | Reference Example 1 |
|---|---|---|---|---|---|---|---|
|  | Type | — | — | Quinolinic acid | — | — | — |
|  | Content (mass %) | — | — | 1.5 | — | — | — |
| Copper ion (C) | Content (ppm) | $6 \times 10^2$ | $3 \times 10^3$ | $7 \times 10^3$ | $4 \times 10^0$ | $3 \times 10^3$ | $1.2 \times 10^4$ |
| Surfactant | Type | Ammonium dodecylbenzene sulfonate | — | Potassium dodecylbenzene sulfonate | Ammonium dodecylbenzene sulfonate | Potassium dodecylbenzene sulfonate | Potassium dodecylbenzene sulfonate |
|  | Content (mass %) | 0.2 | — | 0.1 | 0.2 | 0.04 | 0.1 |
| Oxidizing agent | Type | Hydrogen peroxide | Hydrogen peroxide | Hydrogen peroxide | Hydrogen peroxide | Hydrogen peroxide | Hydrogen peroxide |
|  | Content (mass %) | 0.5 | 0.8 | 0.8 | 0.5 | 0.8 | 0.8 |
|  | pH | 9 | 9 | 9 | 9 | 9 | 9 |
| Polishing results | Polishing rate (nm/min) | 1650 | 1495 | 1100 | 170 | 1210 | 130 |
|  | Erosion (nm) | 52 | 53 | 49 | 40 | 53 | 20 |
| Recycle polishing results | Polishing rate (nm/min) | 1600 | 1410 | 1050 | 210 | 420 | 250 |
|  | Erosion (nm) | 53 | 60 | 50 | 53 | 55 | 41 |

(b) Chemical Mechanical Polishing Aqueous Dispersion Recycling Method 2

In Examples 4 to 6, Comparative Example 3, and Reference Examples 2 and 3, the chemical mechanical polishing aqueous dispersion used as described in the section entitled "4.4.1 Evaluation of copper film polishing rate" was collected, and coarse particles were removed by filtering the chemical mechanical polishing aqueous dispersion through a filter having a pore size of 10 micrometers. The polishing performance of the chemical mechanical polishing aqueous dispersion was evaluated in the same manner as described above. The results are shown in Table 2 ("recycle polishing results").

accurately planarized using the chemical mechanical polishing aqueous dispersions of Examples 1 to 6. Since the recycle polishing results were almost equal to the initial polishing results, it was confirmed that the chemical mechanical polishing aqueous dispersions of Examples 1 to 6 can be recycled without causing a deterioration in polishing performance.

On the other hand, the polishing rate significantly decreased when recycling the chemical mechanical polishing aqueous dispersions of Comparative Examples 1 to 3. It was thus confirmed that it is impossible to recycle the chemical mechanical polishing aqueous dispersions of Comparative Examples 1 to 3.

TABLE 2

|  |  | Example 4 | Example 5 | Example 6 | Comparative Example 3 | Reference Example 2 | Reference Example 3 |
|---|---|---|---|---|---|---|---|
| Abrasive grains (A) | Type | Aqueous dispersion (1) | Aqueous dispersion (2) | Aqueous dispersion (2) | Aqueous dispersion (2) | Aqueous dispersion (1) | Aqueous dispersion (2) |
|  | Content (mass %) | 1.2 | 2.0 | 2.0 | 2.0 | 1.2 | 0.05 |
| Organic acid (B) | Type | Glycine | Aniline | Glycine | — | Glycine | Quinolinic acid |
|  | Content (mass %) | 4.0 | 3.5 | 2.0 | — | 0.01 | 1.2 |
|  | Type | — | — | Quinolinic acid | — | — | — |
|  | Content (mass %) | — | — | 1.5 | — | — | — |
| Copper ion (C) | Content (ppm) | $5.5 \times 10^4$ | $6 \times 10^4$ | $7 \times 10^4$ | $2.5 \times 10^5$ | $4 \times 10^3$ | $3.5 \times 10^3$ |
| Surfactant | Type | Ammonium dodecylbenzene sulfonate | — | Potassium dodecylbenzene sulfonate | Potassium dodecylbenzene sulfonate | Ammonium dodecylbenzene sulfonate | Potassium dodecylbenzene sulfonate |
|  | Content (mass %) | 0.2 | — | 0.1 | 0.04 | 0.2 | 0.1 |
| Oxidizing agent | Type | Hydrogen peroxide | Hydrogen peroxide | Hydrogen peroxide | Hydrogen peroxide | Hydrogen peroxide | Hydrogen peroxide |
|  | Content (mass %) | 0.5 | 0.8 | 0.8 | 0.8 | 0.5 | 0.8 |
|  | pH | 9 | 9 | 9 | 9 | 9 | 9 |
| Polishing results | Polishing rate (nm/min) | 1710 | 1560 | 1350 | 1310 | 190 | 200 |
|  | Erosion (nm) | 50 | 53 | 49 | 55 | 45 | 40 |
| Recycle polishing results | Polishing rate (nm/min) | 1550 | 1450 | 1300 | 410 | 220 | 300 |
|  | Erosion (nm) | 52 | 59 | 50 | 54 | 52 | 39 |

4.4.4 Evaluation Results

As shown in Tables 1 and 2, when using the chemical mechanical polishing aqueous dispersions of Examples 1 to 6, erosion of the polishing target surface can be significantly reduced while achieving a sufficient polishing rate when chemically and mechanically polishing the copper film formed on the semiconductor device substrate. It was confirmed that the polishing target surface can be sufficiently and 4.5 Test Example 2

4.5.1 Evaluation of Copper Film Polishing Rate

A porous polyurethane polishing pad ("IC" manufactured by Rohm and Haas) was installed in a display substrate chemical mechanical polishing apparatus ("EPO-112" manufactured by Ebara Corporation that was remodeled so that a display substrate having a diagonal dimension of 2000 mm could be chemically and mechanically polished). A polishing rate measurement substrate was polished for one minute under the following polishing conditions while supplying the chemical mechanical polishing aqueous dispersion prepared as described in the section entitled "4.3 Preparation of chemical mechanical polishing aqueous dispersion". The copper film polishing rate was calculated by the following method. The copper film polishing rate is preferably 800 nm/min or more, and more preferably 1000 nm/min or more.

(a) Polishing Rate Measurement Substrate

A tantalum nitride barrier metal film (thickness: 30 nm) was deposited on a glass substrate having a diagonal dimension of 2000 mm. Copper was deposited on the barrier metal film by sputtering to a thickness of 2 micrometers.

(b) Polishing Conditions

Polishing pad: "IC 1000" manufactured by Rodel
Head load: 200 g/cm²
Head rotational speed: 80 rpm
Platen rotational speed: 100 rpm
Dispersion supply rate: 200 ml/min (c) Calculation of Polishing Rate The polishing rate was calculated by the following expression (2).

$$\text{Polishing rate (nm/min)} = (\text{film thickness before polishing} - \text{film thickness after polishing})/\text{polishing time} \quad (2)$$

The thickness of each film was determined by measuring the sheet resistance by a four-point probe method using a resistivity meter ("Z-5" manufactured by NPS Inc.), and calculating the thickness by the following expression (3) from the sheet resistance and the resistivity of copper.

$$\text{Film thickness (nm)} = \text{sheet resistance (ohm/cm}^2\text{)} \times \text{resistivity of copper (ohm/cm)} \times 10^{-7} \quad (3)$$

4.5.2 Evaluation of Copper Film Polishing Performance

A barrier metal film (tantalum nitride, thickness: 30 nm) was deposited on the surface of a glass substrate (diagonal dimension: 2000 mm) in which a depression having a depth of 1 micrometer was formed. Copper was deposited on the barrier metal film and inside the depression by sputtering to a thickness of 2 micrometers. The substrate thus obtained is referred to as "substrate a". The substrate a was subjected to chemical mechanical polishing in the same manner as in the section entitled "4.5.1 Evaluation of copper film polishing rate", except that the polishing time was 1.3 times the time from the polishing start time to the endpoint detected based on a change in table torque current. Erosion of the copper interconnect was evaluated as follows.

(a) Evaluation of Erosion

Erosion of the 100-micrometer interconnect formed on the substrate a was evaluated using a surface roughness meter ("P-10" manufactured by KLA-Tencor Corporation). A time (min) obtained by dividing the thickness X (nm) of initial excess copper film by the polishing rate V (nm/min) obtained in the section entitled "4.5.1 Evaluation of copper film polishing rate", and multiplying the resulting value (X/V) (min) by 1.5 was employed as the polishing time.

Table 3 shows the composition of the chemical mechanical polishing aqueous dispersions of Examples 7 and 8 and Comparative Example 7, and the copper film polishing performance evaluation results.

TABLE 3

| | | Example 7 | Example 8 | Comparative Example 4 |
|---|---|---|---|---|
| Abrasive grains (A) | Type | Aqueous dispersion (1) | Aqueous dispersion (2) | Aqueous dispersion (2) |
| | Content (mass %) | 1.2 | 2.0 | 2.0 |
| Organic acid (B) | Type | Glycine | Aniline | — |
| | Content (mass %) | 4.0 | 3.5 | — |
| | Type | — | — | — |
| | Content (mass %) | — | — | — |
| Copper ion (C) | Content (ppm) | 6 × 10³ | 3 × 10⁴ | 3 × 10⁴ |
| Surfactant | Type | Ammonium dodecylbenzene sulfonate | — | Potassium dodecylbenzene sulfonate |
| | Content (mass %) | 0.2 | — | 0.04 |
| Oxidizing agent | Type | Hydrogen peroxide | Hydrogen peroxide | Hydrogen peroxide |
| | Content (mass %) | 0.5 | 0.8 | 0.8 |
| | pH | 9 | 9 | 9 |
| Polishing results | Polishing rate (nm/min) | 1610 | 1590 | 350 |
| | Erosion (nm) | 49 | 50 | 52 |

4.5.3 Evaluation Results

As shown in Table 2, when using the chemical mechanical polishing aqueous dispersions of Examples 7 and 8, erosion of the polishing target surface can be significantly reduced while achieving a sufficient polishing rate when chemically and mechanically polishing the copper film formed on the electro-optical display substrate. It was confirmed that the polishing target surface can be sufficiently and accurately planarized using the chemical mechanical polishing aqueous dispersions of Examples 7 and 8.

When using the chemical mechanical polishing aqueous dispersion of Comparative Example 4, the copper film could not be polished at a sufficient polishing rate.

4.6 Test Example 3

4.6.1 Evaluation of Film Polishing Rate

A porous polyurethane polishing pad ("IC" manufactured by Rohm and Haas) was installed in a chemical mechanical polishing apparatus ("MIRRA-Mesa" manufactured by Applied Materials, Inc.). A polishing rate measurement substrate was polished for one minute under the following polishing conditions while supplying the chemical mechanical polishing aqueous dispersion prepared as described in the section entitled "4.3 Preparation of chemical mechanical polishing aqueous dispersion". The copper film polishing rate, the tantalum film polishing rate, and the insulating film polishing rate were calculated by the following method. The ratios of the copper film polishing rate ($R_{Cu}$), the tantalum film polishing rate ($R_{Ta}$), and the insulating film polishing rate ($R_{TEOS}$) were evaluated based on the following criteria. The $R_{Cu}/R_{Ta}$ value (polishing rate ratio) is preferably 0.3 to 2.5, more preferably 0.5 to 1.5, and particularly preferably 0.8 to 1.4. The $R_{Cu}/R_{TEOS}$ value is preferably 0.3 to 2.5, more preferably 0.5 to 1.5, and particularly preferably 0.8 to 1.4. It was determined that an excellent polishing performance was obtained when each of these polishing rate ratios was within the above preferable range.

(a) Polishing Rate Measurement Substrate

A copper film was deposited on the surface of a substrate (diagonal dimension: 2000 mm) by sputtering to prepare a copper film substrate (maximum dimension: 2000 mm). A tantalum film was deposited on the surface of a substrate (diagonal dimension: 2000 mm) by sputtering to prepare a tantalum film substrate (maximum dimension: 2000 mm). A TEOS film (insulating film) was deposited on the surface of a substrate (diagonal dimension: 2000 mm) by a plasma method to prepare a plasma TEOS film (oxide film) substrate (maximum dimension: 2000 mm).

(b) Polishing Conditions

Polishing pad: "IC 1000" manufactured by Rodel
Head load: 200 g/cm$^2$
Head rotational speed: 60 rpm
Platen rotational speed: 65 rpm
Dispersion supply rate: 150 ml/min (c) Calculation of Polishing Rate The polishing rate was calculated by the following expression (2).

$$\text{Polishing rate (nm/min)} = (\text{film thickness before polishing} - \text{film thickness after polishing})/\text{polishing time} \quad (2)$$

The thickness of the copper film or the tantalum film was measured after polishing using an electric conduction-type thickness meter ("OmniMap RS75" manufactured by KLA-Tencor Corporation). The polishing rate was calculated by the expression (2) from the reduction in thickness due to chemical mechanical polishing and the polishing time.

The thickness of the insulating film was measured after polishing using an optical interference-type thickness meter ("NanoSpec 6100" manufactured by Nanometrics Japan Ltd.). The polishing rate was calculated by the expression (2) from the reduction in thickness due to chemical mechanical polishing and the polishing time.

Table 4 shows the composition of the chemical mechanical polishing aqueous dispersions of Examples 9 to 11 and Comparative Examples 5 to 7, and the film polishing performance evaluation results.

4.6.2 Evaluation of Polishing Performance of Recycled Chemical Mechanical Polishing Aqueous Dispersion In Examples 9 to 11 and Comparative Examples 5 to 7, the chemical mechanical polishing aqueous dispersion used as described in the section entitled "4.6.1 Evaluation of film polishing rate" was collected, and centrifuged (maximum centrifugal acceleration: 1000 G, rotation time: 10 min) using a high-speed refrigerated centrifuge "CR22E" and a continuous rotor "R18C" (manufactured by Hitachi-Koki, Ltd.) to precipitate and collect the abrasive grains. The abrasive grains thus collected were used without drying. The abrasive grains (A), organic acid (B), additives, 30 mass % hydrogen peroxide solution, and at least one atom (C2) selected from Ta, Ti, and Ru were added at a concentration shown in Table 4 on the assumption that all of the abrasive grains had been collected (total mass of chemical mechanical polishing aqueous dispersion=100 mass %). The mixture was then sufficiently stirred. The Ta concentration shown in Table 4 was achieved by adding a Ta-containing dispersion prepared by adding 0.1 g of tantalum pentaethoxide (manufactured by Kojundo Chemical Lab. Co., Ltd.) dropwise to 1 kg of vigorously stirred purified water over one hour. The Ti concentration shown in Table 4 was achieved by adding a Ti-containing dispersion prepared by adding 1 g of titanium tetraethoxide (manufactured by Kojundo Chemical Lab. Co., Ltd.) dropwise to 1 kg of vigorously stirred purified water over one hour. The Ru concentration shown in Table 4 was achieved by adding a 1% ruthenium nitrate aqueous solution. The pH of the chemical mechanical polishing aqueous dispersion was adjusted to 9 by adding aqueous ammonia with stirring. After the addition of ion-exchanged water so that the total amount of the components was 100 mass %, the mixture was stirred for one hour. The mixture was then filtered through a filter having a pore size of 10 micrometers. The polishing performance of the chemical mechanical polishing aqueous dispersion was evaluated in the same manner as in the section entitled "4.6.1 Evaluation of film polishing rate". The results are shown in Table 4 ("recycle polishing results").

TABLE 4

| | | Example 9 | Example 10 | Example 11 | Comparative Example 5 | Comparative Example 6 | Comparative Example 7 |
|---|---|---|---|---|---|---|---|
| Abrasive grains (A) | Type | Aqueous dispersion (1) | Aqueous dispersion (2) | Aqueous dispersion (2) | Aqueous dispersion (1) | Aqueous dispersion (2) | Aqueous dispersion (2) |
| | Content (mass %) | 1.8 | 1.2 | 1.9 | 1.5 | 0.5 | 2.0 |
| Organic acid (B) | Type | Maleic acid | Maleic acid | Maleic acid | Maleic acid | Maleic acid | — |
| | Content (mass %) | 0.8 | 1.2 | 0.03 | 0.6 | 0.6 | — |
| | Type | — | — | Quinolinic acid | — | — | — |
| | Content (mass %) | — | — | 1.5 | — | — | — |
| Metal atom (C) | TaContent (ppm) | $2 \times 10^1$ | $3 \times 10^0$ | $4 \times 10^0$ | $2 \times 10^3$ | — | $5 \times 10^0$ |
| | TiContent (ppm) | — | $2 \times 10^1$ | $3 \times 10^0$ | $2 \times 10^3$ | — | — |
| | RuContent (ppm) | $4 \times 10^1$ | $4 \times 10^0$ | — | — | — | — |
| Water-soluble polymer | Type | Polyacrylic acid | Polyacrylate | — | Polyacrylate | — | Polyacrylic acid |
| | Content (mass %) | 0.2 | 0.2 | — | 0.1 | — | 0.15 |
| Oxidizing agent | Type | Hydrogen peroxide | Hydrogen peroxide | Hydrogen peroxide | — | Hydrogen peroxide | Hydrogen peroxide |
| | Content (mass %) | 0.5 | 0.2 | 0.5 | — | 0.2 | 0.5 |
| Polishing results | $R_{Cu}$ (nm/分) | 41 | 39 | 37 | 10 | 11 | 12 |
| | $R_{Ta}$ (nm/分) | 45 | 40 | 33 | 6 | 18 | 6 |
| | $R_{TEOS}$ (nm/分) | 40 | 38 | 40 | 38 | 16 | 27 |
| | $R_{Cu}/R_{Ta}$ | 0.91 | 0.98 | 1.12 | 1.67 | 0.61 | 2.00 |
| | $R_{Cu}/R_{TEOS}$ | 1.03 | 1.03 | 0.93 | 0.26 | 0.69 | 0.44 |
| Recycle polishing results | $R_{Cu}$ (nm/分) | 40 | 41 | 40 | 8 | 9 | 20 |
| | $R_{Ta}$ (nm/分) | 44 | 42 | 35 | 11 | 45 | 13 |
| | $R_{TEOS}$ (nm/分) | 41 | 39 | 41 | 20 | 25 | 30 |

TABLE 4-continued

|  | Example 9 | Example 10 | Example 11 | Comparative Example 5 | Comparative Example 6 | Comparative Example 7 |
|---|---|---|---|---|---|---|
| $R_{Cu}/R_{Ta}$ | 0.91 | 0.98 | 1.14 | 0.73 | 0.20 | 1.54 |
| $R_{Cu}/R_{TEOS}$ | 0.98 | 1.05 | 0.98 | 0.40 | 0.36 | 0.67 |

4.6.3 Evaluation Results

When using the chemical mechanical polishing aqueous dispersions of Examples 9 to 11, the polishing rate of each film (Cu, Ta, TEOS) was sufficiently high (33 nm/min or more). The $R_{Cu}/R_{Ta}$ value was 0.91 to 1.12, and the $R_{Cu}/R_{TEOS}$ value was 0.93 to 1.03. Since each polishing rate ratio was within an appropriate range, excellent flatness can be achieved.

The chemical mechanical polishing aqueous dispersion of Comparative Example 5 contained at least one atom (C2) selected from Ta, Ti, and Ru at a concentration higher than the upper limit. As a result, the polishing rate was insufficient, and the polishing rate ratio was outside the preferable range.

The chemical mechanical polishing aqueous dispersion of Comparative Example 6 did not contain at least one atom (C2) selected from Ta, Ti, and Ru. As a result, the polishing rate ratio was outside the preferable range (i.e., excellent flatness cannot be obtained).

The chemical mechanical polishing aqueous dispersion of Comparative Example 7 did not contain the organic acid (B). As a result, the barrier metal film polishing rate was insufficient, and the polishing rate ratio was outside the preferable range.

As described above, the object of the invention cannot be achieved by the chemical mechanical polishing aqueous dispersions of Comparative Examples 5 to 7.

4.7 Test Example 4

4.7.1 Evaluation of Polishing Rate

A porous polyurethane polishing pad ("IC" manufactured by Rohm and Haas) was installed in a display substrate chemical mechanical polishing apparatus ("EPO-112" manufactured by Ebara Corporation that was remodeled so that a display substrate having a diagonal dimension of 2000 mm could be chemically and mechanically polished). A polishing rate measurement substrate was polished for one minute under the following polishing conditions while supplying the chemical mechanical polishing aqueous dispersion prepared as described in the section entitled "4.3 Preparation of chemical mechanical polishing aqueous dispersion". The copper film polishing rate, the tantalum film polishing rate, and the insulating film polishing rate were calculated by the following method. The ratios of the copper film polishing rate ($R_{Cu}$), the tantalum film polishing rate ($R_{Ta}$), and the insulating film polishing rate ($R_{TEOS}$) were evaluated based on the following criteria. The $R_{Cu}/R_{Ta}$ value (polishing rate ratio) is preferably 0.3 to 2.5, more preferably 0.5 to 1.5, and particularly preferably 0.8 to 1.4. The $R_{Cu}/R_{TEOS}$ value is preferably 0.3 to 2.5, more preferably 0.5 to 1.5, and particularly preferably 0.8 to 1.4. It was determined that an excellent polishing performance was obtained when each of these polishing rate ratios was within the above preferable range.

(a) Polishing Rate Measurement Substrate

A copper film was deposited on the surface of a glass substrate (diagonal dimension: 2000 mm) by sputtering to prepare a copper film substrate (maximum dimension: 2000 mm). A tantalum film was deposited on the surface of a glass substrate (diagonal dimension: 2000 mm) by sputtering to prepare a tantalum film substrate (maximum dimension: 2000 mm). A TEOS film (insulating film) was deposited on the surface of a glass substrate (diagonal dimension: 2000 mm) by a plasma method to prepare a plasma TEOS film (oxide film) substrate (maximum dimension: 2000 mm).

(b) Polishing Conditions

Polishing pad: "IC 1000" manufactured by Rodel
Head load: 200 g/cm$^2$
Head rotational speed: 60 rpm
Platen rotational speed: 65 rpm
Dispersion supply rate: 150 ml/min (c) Calculation of Polishing Rate The polishing rate was calculated by the following expression (2).

$$\text{Polishing rate (nm/min)} = (\text{film thickness before polishing} - \text{film thickness after polishing})/\text{polishing time} \quad (2)$$

The thickness of the copper film or the tantalum film was measured after polishing using an electric conduction-type thickness meter ("OmniMap RS75" manufactured by KLA-Tencor Corporation). The polishing rate was calculated by the expression (2) from the reduction in thickness due to chemical mechanical polishing and the polishing time.

The thickness of the insulating film was measured after polishing using an optical interference-type thickness meter ("NanoSpec 6100" manufactured by Nanometrics Japan Ltd.). The polishing rate was calculated by the expression (2) from the reduction in thickness due to chemical mechanical polishing and the polishing time.

Table 5 shows the composition of the chemical mechanical polishing aqueous dispersions of Examples 12 to 14 and Comparative Examples 8 to 10, and the copper film polishing performance evaluation results.

TABLE 5

|  |  | Example 12 | Example 13 | Example 14 | Comparative Example 8 | Comparative Example 9 | Comparative Example 10 |
|---|---|---|---|---|---|---|---|
| Abrasive grains (A) | Type | Aqueous dispersion (1) | Aqueous dispersion (2) | Aqueous dispersion (2) | Aqueous dispersion (1) | Aqueous dispersion (2) | Aqueous dispersion (2) |
|  | Content (mass %) | 2.0 | 1.2 | 2.0 | 1.5 | 0.5 | 2.0 |
| Organic acid (B) | Type | Maleic acid | Maleic acid | Maleic acid | Maleic acid | Maleic acid | — |
|  | Content (mass %) | 0.8 | 1.2 | 0.03 | 0.6 | 0.6 | — |

TABLE 5-continued

| | | Example 12 | Example 13 | Example 14 | Comparative Example 8 | Comparative Example 9 | Comparative Example 10 |
|---|---|---|---|---|---|---|---|
| | Type | — | — | Quinolinic acid | — | — | — |
| | Content (mass %) | — | — | 1.5 | — | — | — |
| Metal atom (C) | TaContent (ppm) | $2 \times 10^2$ | $3 \times 10^2$ | $4 \times 10^1$ | $2 \times 10^3$ | — | $5 \times 10^0$ |
| | TiContent (ppm) | — | $2 \times 10^2$ | $3 \times 10^2$ | $2 \times 10^3$ | — | — |
| | RuContent (ppm) | $4 \times 10^1$ | $4 \times 10^1$ | — | — | — | — |
| Water-soluble polymer | Type | Polyacrylic acid | Polyacrylate | — | Polyacrylate | — | Polyacrylic acid |
| | Content (mass %) | 0.2 | 0.2 | — | 0.1 | — | 0.15 |
| Oxidizing agent | Type | Hydrogen peroxide | Hydrogen peroxide | Hydrogen peroxide | — | Hydrogen peroxide | Hydrogen peroxide |
| | Content (mass %) | 0.5 | 0.3 | 0.5 | — | 0.2 | 0.5 |
| Polishing results | $R_{Cu}$ (nm/分) | 40 | 43 | 39 | 6 | 10 | 11 |
| | $R_{Ta}$ (nm/分) | 43 | 42 | 28 | 3 | 20 | 4 |
| | $R_{TEOS}$ (nm/分) | 42 | 40 | 33 | 29 | 15 | 29 |
| | $R_{Cu}/R_{Ta}$ | 0.93 | 1.02 | 1.39 | 2.00 | 0.50 | 2.75 |
| | $R_{Cu}/R_{TEOS}$ | 0.95 | 1.08 | 1.18 | 0.21 | 0.67 | 0.38 |

4.7.2 Evaluation Results

When using the chemical mechanical polishing aqueous dispersions of Examples 12 to 14, the polishing rate of each film (Cu, Ta, TEOS) was sufficiently high (28 nm/min or more). The $R_{Cu}/R_{Ta}$ value was 0.93 to 1.39, and the $R_{Cu}/R_{TEOS}$ value was 0.95 to 1.18. Since each polishing rate ratio was within an appropriate range, excellent flatness can be achieved.

The chemical mechanical polishing aqueous dispersion of Comparative Example 8 contained at least one atom (C2) selected from Ta, Ti, and Ru at a concentration higher than the upper limit. As a result, the polishing rate was insufficient, and the polishing rate ratio was outside the preferable range.

The chemical mechanical polishing aqueous dispersion of Comparative Example 9 did not contain at least one atom (C2) selected from Ta, Ti, and Ru. As a result, the polishing rate ratio was outside the preferable range (i.e., excellent flatness cannot be obtained).

The chemical mechanical polishing aqueous dispersion of Comparative Example 10 did not contain the organic acid (B). As a result, the barrier metal film polishing rate was insufficient, and the polishing rate ratio was outside the preferable range.

As described above, the object of the invention cannot be achieved by the chemical mechanical polishing aqueous dispersions of Comparative Examples 8 to 10.

The invention claimed is:

1. A chemical mechanical polishing aqueous dispersion being recycled without removing copper ions that have been dissolved by subjecting an interconnect layer comprising at least copper or a copper alloy to chemical mechanical polishing, the chemical mechanical polishing aqueous dispersion comprising:
   (A) abrasive grains;
   (B) an organic acid; and
   (C1) copper ions,
   wherein the concentration of the copper ions (C1) is from $5 \times 10^4$ to $2 \times 10^5$ ppm and
   wherein the chemical mechanical polishing aqueous dispersion is recycled without removing copper ions that have been dissolved by subjecting an interconnect layer comprising at least copper or a copper alloy to chemical mechanical polishing.

2. The chemical mechanical polishing aqueous dispersion according to claim 1, wherein the organic acid (B) is at least one organic acid selected from a compound that includes a nitrogen-containing heterocyclic five-membered ring and a carboxyl group, a compound that includes a nitrogen-containing six-membered ring and a carboxyl group, and an amino acid.

3. A chemical mechanical polishing aqueous dispersion being recycled after removing metal atoms that have been dissolved by subjecting a barrier metal film that includes at least one metal selected from Ta, Ti, and Rb to chemical mechanical polishing, comprising:
   (A) abrasive grains;
   (B) an organic acid; and
   (C2) at least one metal atom selected from the group consisting of Ta, Ti, and Rb, and the concentration of (C2) is $1 \times 10^{-1}$ to $1 \times 10^2$ ppm.

4. The chemical mechanical polishing aqueous dispersion according to claim 3, wherein the organic acid (B) is a compound that includes two or more carboxyl groups.

5. The chemical mechanical polishing aqueous dispersion according to claim 3, further comprising (E) a water-soluble polymer.

6. The chemical mechanical polishing aqueous dispersion according to claim 5, wherein the water-soluble polymer (E) has a weight average molecular weight of 50,000 to 5,000,000.

7. A chemical mechanical polishing aqueous dispersion being used to polish a barrier metal film that is provided on an electro-optical display substrate and includes at least one metal selected from Ta, Ti, and Rb, comprising:
   (A) abrasive grains;
   (B) an organic acid; and
   (C2) at least one metal selected from the group consisting of Ta, Ti, and Rb, and the concentration of (C2) is $1 \times 10^1$ to $1 \times 10^3$ ppm.

8. The chemical mechanical polishing aqueous dispersion according to claim 7, wherein the organic acid (B) is a compound that includes two or more carboxyl groups.

9. The chemical mechanical polishing aqueous dispersion according to claim 7, further comprising (E) a water-soluble polymer.

10. The chemical mechanical polishing aqueous dispersion according to claim 9, wherein the water-soluble polymer (E) has a weight average molecular weight of 50,000 to 5,000,000.

11. The chemical mechanical polishing aqueous dispersion according to claim 9, wherein the abrasive grains (A) are silica.

12. The chemical mechanical polishing aqueous dispersion according to claim 1, further comprising (D) a surfactant.

13. A chemical mechanical polishing method comprising polishing a barrier metal film that includes at least one metal selected from Ta, Ti, and Rb using the chemical mechanical polishing aqueous dispersion according to claim 3.

14. A chemical mechanical polishing method comprising polishing a barrier metal film that includes at least one metal selected from Ta, Ti, and Rb using the chemical mechanical polishing aqueous dispersion according to claim 7.

* * * * *